United States Patent [19]

Goto et al.

[11] Patent Number: 5,504,596
[45] Date of Patent: Apr. 2, 1996

[54] EXPOSURE METHOD AND APPARATUS USING HOLOGRAPHIC TECHNIQUES

[75] Inventors: Akihiro Goto; Takashi Gemma, both of Tokyo; Yutaka Ichihara, Yokohama; Nobutaka Magome; Naomasa Shiraishi, both of Kawasaki; Hiroshi Shirasu, Yokohama; Toshio Matsuura, Tokyo, all of Japan

[73] Assignee: Nikon Corporation, Tokyo, Japan

[21] Appl. No.: 169,055

[22] Filed: Dec. 20, 1993

[30] Foreign Application Priority Data

| Dec. 21, 1992 | [JP] | Japan | 4-355424 |
| Jul. 26, 1993 | [JP] | Japan | 5-202471 |
| Jul. 26, 1993 | [JP] | Japan | 5-202472 |
| Jul. 26, 1993 | [JP] | Japan | 5-202473 |

[51] Int. Cl.$^6$ ................................................ G03H 1/26
[52] U.S. Cl. .................... 359/24; 430/1; 430/22; 356/401
[58] Field of Search .................. 430/1, 22; 356/363, 356/401; 359/35, 24

[56] References Cited

U.S. PATENT DOCUMENTS

| 3,635,540 | 1/1972 | Nassenstein | 430/1 |
| 3,796,476 | 3/1974 | Frosch et al. | 359/1 |
| 4,405,238 | 9/1983 | Grobman et al. | 356/401 |
| 4,779,001 | 10/1988 | Makosch | 356/401 |
| 4,815,854 | 3/1989 | Tanaka et al. | 356/363 |
| 4,835,078 | 5/1989 | Harvey et al. | 430/22 |
| 4,857,425 | 8/1989 | Phillips | 430/1 |
| 4,948,983 | 8/1990 | Maruyama et al. | 356/401 |
| 5,148,306 | 9/1992 | Matsugu et al. | 356/401 |
| 5,187,372 | 2/1993 | Clube | 356/401 |
| 5,235,408 | 8/1993 | Matsugu et al. | 356/401 |
| 5,322,747 | 6/1994 | Hugle | 430/1 |

FOREIGN PATENT DOCUMENTS

| 0421645 | 4/1991 | European Pat. Off. | 430/1 |
| 0560310 | 9/1993 | European Pat. Off. | 430/1 |
| 3-235319 | 10/1991 | Japan | |
| 2249387 | 5/1992 | United Kingdom | 430/1 |

OTHER PUBLICATIONS

Hologram Recording by Photo–polymer, by T. Yamaoka, O plus E, Japanese Version, No. 133, Dec. 1990, pp. 105–115.
Holography With Total Internally Reflected Light, by K. A. Stetson, Applied Physics Letters, vol. 11, No. 7, Oct. 1, 1967 pp. 225 and 226.
Self–Pumped, Continuous–Wave Phase Conjugator Using Internal Reflection, by J. Feinberg, Optics Letters, vol. 7, No. 10, Oct. 1982, pp. 486–488.
Development of Lithography Making Use of Holography, by B. A. Omar et al., Solid State Technology, Japanese Version, Nov. 1991, pp. 44–49.

(List continued on next page.)

Primary Examiner—Paul M. Dzierzynski
Assistant Examiner—John Juba, Jr.
Attorney, Agent, or Firm—Keck, Mahin & Cate

[57] ABSTRACT

An exposure apparatus is used for reproducing a mask pattern of a semiconductor device or the like onto a photosensitive substrate using a holography. The holography is utilized also in a process for alignment between a mask pattern hologram and an exposure region of the substrate. The pattern hologram is recorded to a recording medium by interference between an object wave from the pattern and a reference wave, and a second hologram is formed to the medium by diffraction light from an alignment mark formed on the mask. Prior to reconstruction of the pattern image, reconstruction light from the second hologram, illuminated with a reconstruction wave, is irradiated onto the substrate arranged in place of the mask. A reproduction image of the alignment mark on the substrate surface illuminated with the reconstruction light is measured, and relative displacement between the medium and the substrate is detected from a result of the measurement. The relative positional relationship between the medium and the substrate is corrected in accordance with the displacement information, and, thereafter, the surface is exposed with a reconstruction image of the pattern hologram.

3 Claims, 10 Drawing Sheets

OTHER PUBLICATIONS

Improved Resolution and Signal–to–Noise Ratios in Total Internal Reflection Holograms, by K. A. Stetson, Applied Physics Letters, vol. 12, No. 11, Jun. 1, 1968, pp. 362–364.

"Recent Roughness Measurement by Optical Contact," O plus E, No. 65, Apr. 1985, pp. 71–75, Japanese Version.

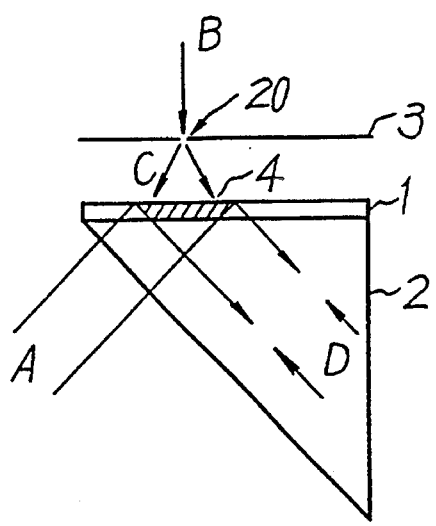
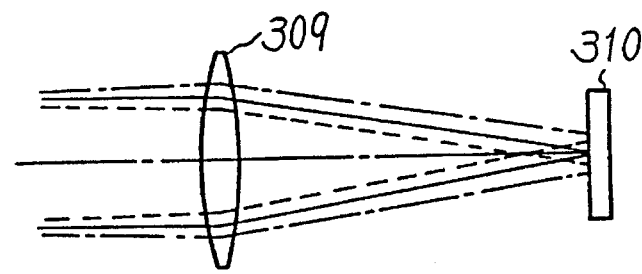
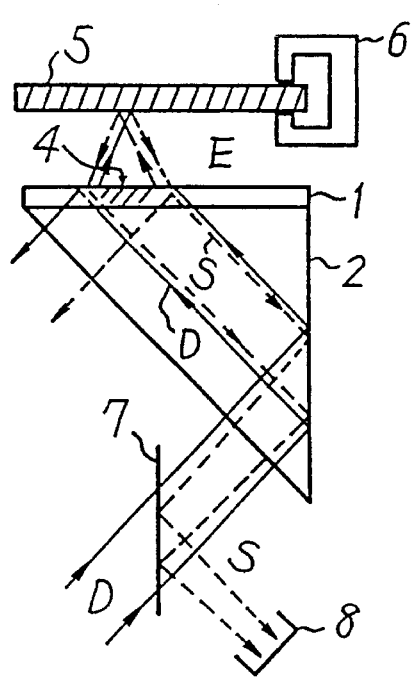
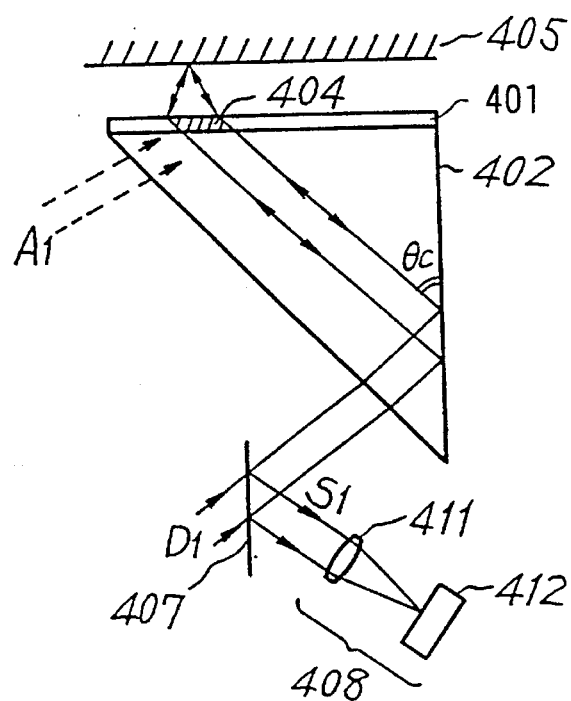
FIG. 1
FIG. 3
FIG. 2
FIG. 4

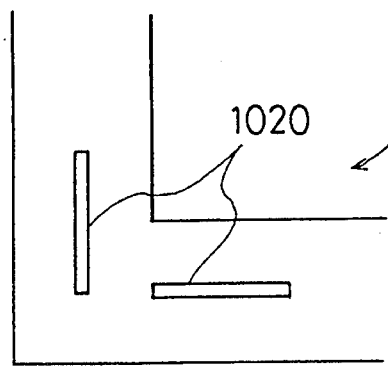
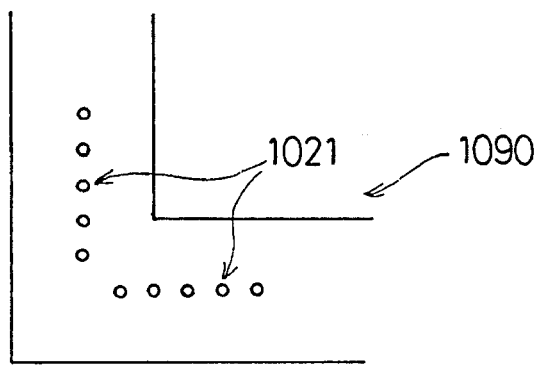
FIG. 9A   FIG. 9B
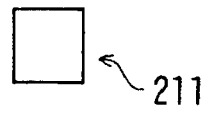
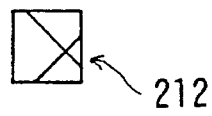
FIG. 10A
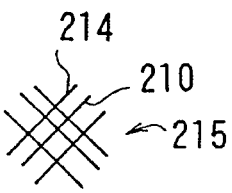
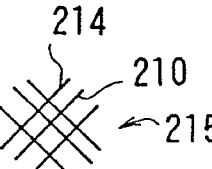
FIG. 10B
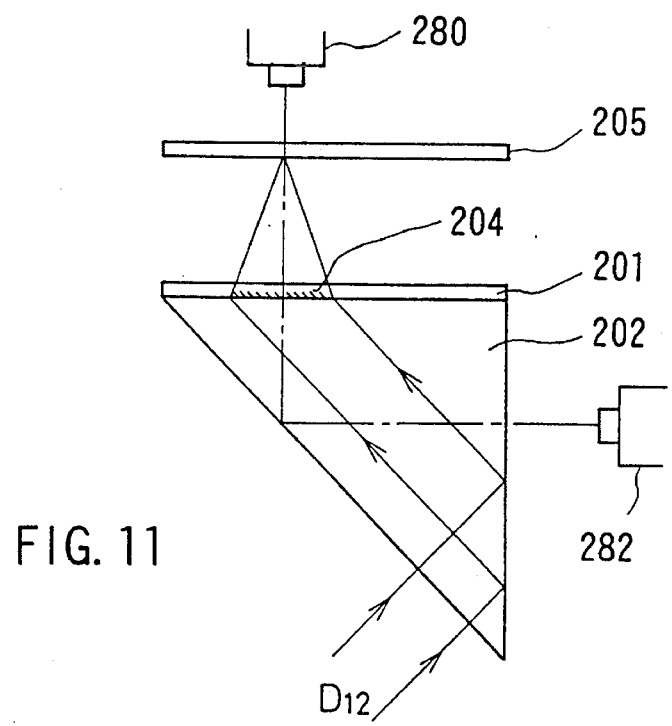
FIG. 11

EXPOSURE METHOD AND APPARATUS USING HOLOGRAPHIC TECHNIQUES

BACKGROUND OF THE INVENTION

1. Field of the Invention

This invention relates to an exposure method and apparatus for reproducing a pattern of a mask, for example, for manufacturing semiconductor devices onto a photosensitive surface of a substrate using holographic techniques, and more particularly to an exposure technique for utilizing holographic techniques also for an alignment process for adjusting the relative positional relationship between a hologram on which information corresponding to a mask pattern is recorded and the surface of the substrate.

2. Description of the Prior Art

With respect to a holographic technique useful to reproduce a fine pattern for integrated circuits by exposure onto a resist layer coated on a wafer, the reference can be made to a report entitled "Holography with Total Internally Reflected Light", by K. A. Stetson, Applied Physics Letters, Vol. 11, No. 7, Oct. 1, 1967, pp. 225–226.

Recording and reconstruction of a hologram of the type mentioned are performed in the following manner. First, upon recording operation, a coherent light beam is irradiated upon a mask, and a subject beam transmitted through and diffracted by a mask enters into a recording medium while another coherent reference beam enters into the recording medium from the opposite side to the mask by way of a prism. Then, the reference beam is totally internally reflected from a boundary of the recording medium from the air. Consequently, the incident and totally reflected reference beam and the subject beam interfere with each other within the recording medium to form interference fringes corresponding to the mask pattern in the recording medium and record them as a hologram. Meanwhile, reconstruction of the thus recorded hologram is performed by irradiating a reconstructing beam conjugate with the reference beam into the hologram recording medium. In this instance, if a wafer is disposed at the position of the mask in place of the mask, then a real image (mask pattern) of the hologram is formed on the wafer. For example, N. J. Phillips actually discloses, in U.S. Pat. No. 4,857,425, a process of manufacturing integrated circuits using holographic techniques of the type just described.

A reconstruction image of a hologram according to holographic techniques is formed at a same position as the position of a mask pattern used for formation of the hologram with respect to the hologram. Consequently, a mask used in the hologram formation procedure is removed after the hologram has been formed, and if a wafer is fixed at the same position instead and the hologram is reconstructed in this condition, then a reconstruction hologram image is formed on the wafer (the position of the preceding mask), and consequently, the mask pattern is exposed to the wafer.

Since the reconstruction hologram image of the mask pattern is not reproduced accurately on the wafer unless the relative positional relationship between the wafer and the hologram upon reproduction of the mask pattern is not the same as the relative positional relationship between the mask pattern and the hologram upon formation of the hologram, an exposure operation to the wafer must necessarily be performed after accurate alignment is established between the two relative positional relationships, that is, in terms of a relative distance (gap in a Z direction), in an planar direction (x-y direction), a rotational error, an inclination and so forth. The report of K. A. Stetson mentioned above does not include any description of utilization of holographic techniques for such alignment.

An example of conventional lithography which makes use of holographic techniques is disclosed also in Japanese Patent Laid-Open Application No. 235319/1991. According to the prior art technique, a fine pattern of a hologram is reproduced onto a resist layer formed on a wafer through a projection lens making use of the fact that an aberration produced with a projection lens can be cancelled by applying a holographic technique.

Generally, in order to produce a circuit pattern of a semiconductor or liquid crystal device, a plurality of exposure operations of masks are required for a same wafer, and it is necessary to achieve positioning (x-y alignment) with respect to a pattern formed already on the wafer together with detection of a gap for focusing (relative distance between the hologram and the mask or wafer). It is to be noted that adjustment of any relative positional relationship such as x-y alignment or gap alignment will be hereinafter referred to "alignment".

In the conventional alignment system disclosed in Japanese Patent Laid-Open No. 235319/1991 mentioned above, an ordinary alignment mark of the shape of a grating is formed on the outside of a fine pattern of a hologram, and an enlarged projection image of the grating mark is formed on a wafer through the projection lens and an overlapping condition between the enlarged projection image and a wafer alignment mark (also having the shape of a similar grating) formed in advance on the wafer is detected. In this instance, since the projection image of the mask arignment mark is formed on the surface of the wafer by way of the projection optical system in order to effect detection of the relative position from overlapping with the wafer alignment mark, an influence of an aberration of the projection optical system, which is disadvantageous for adjustment of the relative positional relationship between the hologram recording medium and the wafer, still remains. Consequently, although the advantage that the influence of an aberration upon reconstruction of a hologram fine pattern is reduced can be obtained, there is a disadvantage that exposure of a fine pattern is difficult from a limitation in accuracy in alignment particularly upon overlapping exposure which involves a plurality of exposure operations. Further, with the alignment system, since the projection image of the mask alignment mark is enlarged by the projection optical system, an observation optical system of a large size is necessitated and also the restriction of the entire apparatus on the arrangement construction is great. Particularly where total internal reflection holography is utilized, since a prism is disposed in contact with the hologram recording medium, the observation optical system cannot be positioned near to the wafer due to the presence of the prism, and it is difficult to increase the resolution of the observation optical system for the mask alignment mark image projected in an enlarged scale. In addition, when it is tried to make use of the present alignment system for total internal reflection holography, a large projection area for the mask alignment mark must be prepared on the surface of the wafer, resulting in reduction of the effective area for a circuit pattern to be reproduced originally onto the wafer.

Further, it is recited in "Development of Lithography Making Use of Holography", Solid State Technology Japanese Version, November, 1991, that a gap between a hologram and a wafer in lithography making use of total internal reflection holography was measured with a multiplexed wavelength phase stepping scanning interferometer by A.

Omar Basil et al. In the measurement disclosed in the document, as shown in FIG. 26 attached herewith, a laser beam is introduced perpendicularly into a hologram recording medium 1201 and a wafer 1205, and interference waves between reflection light from the surface of the hologram recording medium 1201 and internal reflection light from the surface of a resist applied to the wafer 1205 are detected by a detector 1208. Then, a gap between the hologram recording medium and the wafer is measured from a variation of the detector output which arises from the gap. The gap measurement system disclosed in the document is disadvantageous in that, since a laser beam (parallel beam) is introduced perpendicularly into both of the wafer and the hologram recording medium, the result of the measurement is liable to be influenced by multiple reflection which occurs between the two elements. Further, since it is necessary to measure the gap upon hologram recording in advance and then adjust the gap to the measurement value upon reconstruction, accurate measurement of the gap is repeated upon recording and reconstruction of the hologram, resulting in reduction of the throughput of the exposure apparatus.

It cannot be denied that, up to the present, a hologram is sometimes deformed in such operations as recording, fixing and reconstruction of the hologram. For example, when such deformation as partial contraction of a medium on which a hologram is recorded occurs, also the position at which a reconstruction image of the hologram is formed is varied by the thus deformed hologram. Consequently, at the exposure step to a wafer, the position of the wafer must necessarily be modified from the position measured precedently upon recording of the hologram. However, any of the prior art techniques can little achieve alignment for coping with such hologram deformation particularly including correction against a variation of the focus position.

SUMMARY OF THE INVENTION

It is an object of the present invention to solve the problems of the prior art techniques described above and particularly to provide an exposure method and apparatus by which an alignment system wherein the relative positional relationship of a hologram in a plane substantially parallel to a photosensitive surface of a substrate and the gap between the hologram and the substrate can be measured readily and accurately and the problem of deformation of the hologram is eliminated can be realized making use of holographic techniques.

According to a basic concept of the present invention, a holographic technique is utilized also for the relative positioning (alignment) between a hologram recording medium for reproducing a mask pattern onto a photosensitive surface of a substrate making use of the holographic technique and the substrate, that is, between a hologram recorded on the hologram recording medium and a region on the substrate to be exposed.

According to a first aspect of the present invention, there is provided an exposure method for reproducing a pattern of a mask onto a photosensitive surface of a substrate making use of a holographic technique, comprising the steps of causing a first object wave derived from diffraction light from the mask pattern and a reference wave of coherent light to interfere with each other to record a first hologram of the mask pattern onto a hologram recording medium, irradiating a first reconstruction wave conjugate with the reference wave onto the first hologram to reconstruct an image of the mask pattern on the photo sensitive surface of the substrate arranged in place of the mask, recording a second hologram of an alignment mark formed on the mask onto the hologram recording medium with a second object wave derived from diffraction light from the alignment mark, irradiating, prior to the reconstruction of the image of the mask pattern, a reconstruction light onto the surface of the substrate, said reconstruction light being obtained by irradiating a second reconstruction wave onto the second hologram, measuring a reconstruction condition of an image of the alignment mark on the surface of the substrate irradiated with the reconstruction light, detecting information of relative displacement between the hologram recording medium and the substrate in accordance with a result of measurement at said measuring step, and correcting a relative positional relationship between the hologram recording medium and the substrate in accordance with the relative displacement information.

According to a second aspect of the present invention, there is provided an exposure method for reproducing a pattern of a mask onto a photosensitive surface of a substrate making use of a total internal reflection holographic technique, comprising the steps of causing a first object wave derived from transmission diffraction light from the mask pattern and a reference wave of coherent light to interfere with each other to record a first hologram of the mask pattern on a hologram recording medium, irradiating a first reconstruction wave conjugate with the reference wave onto the first hologram to reconstruct an image of the mask pattern onto the photosensitive surface of the substrate arranged in place of the mask, recording a second hologram of a zone plate pattern of an alignment mark formed on the mask onto the hologram recording medium with a second object wave derived from transmission diffraction light from the alignment mark, irradiating, prior to the reconstruction of the image of the mask pattern, a reconstruction light onto the surface of the substrate, said reconstruction light being obtained by irradiating a second reconstruction wave onto the second hologram, measuring a reconstruction condition of an image of the alignment mark on the surface of the substrate by detecting reflection light or transmission light from the surface of the substrate irradiated with the reconstruction light, detecting information of relative displacement between the hologram recording medium and the substrate in accordance with a result of measurement at the measuring step, and correcting a relative positional relationship between the hologram recording medium and the substrate in accordance with the relative displacement information.

According to a modification to the second aspect of the present invention, the measuring step of measuring a reconstruction condition of an image of the alignment mark includes the steps of introducing reflection light from the surface of the substrate irradiated with the reconstruction light to the zone plate pattern of the second hologram, and detecting a wave front of transmission diffraction light, which is produced from the zone plate pattern by reflection light of the reconstruction wave, to measure a reconstruction condition of the image of the alignment mark on the surface of the substrate.

According to a third aspect of the present invention, there is provided an exposure method for reproducing a pattern of a mask onto a photosensitive surface of a substrate making use of a holographic technique, comprising the steps of causing a first object wave derived from diffraction light from the mask pattern and a reference wave of coherent light to interfere with each other to record a first hologram of the mask pattern onto a hologram recording medium, irradiating a first reconstruction wave conjugate with the reference wave onto the first hologram to reconstruct an image of the mask pattern on the photo sensitive surface of the substrate arranged in place of the mask, recording a second hologram of a first alignment mark formed on the mask onto the hologram recording medium with a second object wave derived from diffraction light from the first alignment mark, irradiating, prior to reconstruction of the image of the mask pattern, a reconstruction light onto a second alignment mark provided on the surface of the substrate, said reconstruction light being obtained by irradiating a second reconstruction wave onto the second hologram, measuring reflection light or transmission light from the second alignment mark irradiated with the reconstruction light, detecting information of relative displacement between the hologram recording medium and the substrate in accordance with a result of measurement at the measuring step, and correcting a relative positional relationship between the hologram recording medium and the substrate in accordance with the relative displacement information.

According to a fourth aspect of the present invention, there is provided an exposure method for reproducing a pattern of a mask onto a photosensitive surface of a substrate making use of a holographic technique, comprising the steps of causing a first object wave derived from diffraction light from the mask pattern and a reference wave of coherent light to interfere with each other to record a first hologram of the mask pattern onto a hologram recording medium, irradiating a first reconstruction wave conjugate with the reference wave onto the first hologram to reconstruct an image of the mask pattern onto the photo sensitive surface of the substrate arranged in place of the mask, recording a second hologram of a first alignment mark formed on the mask onto the hologram recording medium with a second object wave derived from diffraction light from the first alignment mark, irradiating, prior to reconstruction of the mask pattern image, illumination light of a wavelength equal to that of the second object wave onto a second alignment mark provided on the surface of the substrate, irradiating a second reconstruction wave derived from diffraction light produced from the second alignment mark illuminated with the illumination light onto the second hologram, measuring transmission light from the second hologram illuminated with the second reconstruction wave, detecting information of relative displacement between the hologram recording medium and the substrate in accordance with a result of measurement at the measuring step, and correcting a relative positional relationship between the hologram recording medium and the substrate in accordance with the relative displacement information.

According to a modification to the fourth aspect of the present invention, the first alignment mark has a zone plate pattern, and the second alignment mark has a predetermined pattern selected so that the second reconstruction wave may be of a diffraction wave equivalent to the second object wave.

According to another modification to the fourth aspect of the present invention, the exposure method further comprises the steps of irradiating inspection light, which is same as a reference wave used for interference with the second object wave upon recording of the second hologram, onto the second hologram, measuring light emitted from the second hologram illuminated with the inspection light, and detecting information of relative displacement between the hologram recording medium and a wafer in accordance with a result of measurement at the measuring step.

An exposure apparatus for performing the exposure methods of the present invention described above comprises a main system for reproducing the mask pattern onto the photosensitive surface of the substrate making use of the holographic technique, and an alignment system for establishing alignment of the relative positional relationship between the hologram recording medium and the substrate upon reproduction operation by the main system.

The main system basically has a function of causing a first object wave derived from diffraction light from the mask pattern and a reference wave of coherent light to interfere with each other to record a first hologram of the mask pattern onto a hologram recording medium, and another function of irradiating a first reconstruction wave conjugate with the reference wave onto the first hologram to reconstruct an image of the mask pattern onto the photo sensitive surface of the substrate arranged in place of the mask.

According to a preferred form, the main system includes:

a mask having a predetermined pattern, a hologram recording medium having a recording layer made of, for example, a photo-polymeric material onto which a hologram can be recorded by a photo-chemical reaction, supporting means adapted to hold the recording medium at a predetermined position during recording operation to form a first hologram corresponding to the pattern of the mask ontothe recording medium and during reconstruction operation to form a reconstruction image of the first hologram thus formed, a first irradiation optical system for introducing, upon the recording operation, a coherent beam to the mask arranged with a predetermined gap left from the recording medium and irradiating an object wave produced from the mask illuminated by said coherent beam onto the recording layer of the recording medium through said gap, a second irradiation optical system for irradiating, upon the recording operation, a coherent beam as a reference wave onto the recording medium so as to form interference fringes with the object wave in the recording layer of the recording medium, means for arranging, upon the reconstruction operation, the substrate at the position of the mask in place of the mask, and a third irradiation optical system for irradiating, upon the reconstruction operation, a conjugate wave with the reference wave used in the recording operation onto the recording medium, on which a first hologram corresponding to the pattern is formed by the recording operation, to form a reconstruction image of the first hologram onto the photosensitive surface of the substrate.

The exposure apparatus having such basic construction as described above is characterized, according to the present invention, principally by the alignment system.

In particular, according to a fifth aspect of the present invention, there is provided an exposure apparatus which includes, in order to reproduce a pattern of a mask onto a photosensitive surface of a substrate making use of a holographic technique, means for causing a first object wave derived from diffraction light from the mask pattern and a reference wave of coherent light to interfere with each other to record a first hologram of the mask pattern onto a hologram recording medium, and means irradiating a first reconstruction wave conjugate with the reference wave onto the first hologram to reconstruct an image of the mask pattern onto the photosensitive surface of the substrate arranged in place of the mask, comprising:

a coherent light source for generating a coherent beam, an object wave irradiation optical system for introducing the coherent beam from the light source to a first alignment mark formed on the mask and irradiating diffraction light produced from the first alignment mark illuminated with said coherent beam onto the hologram recording medium as a second object wave for formation of a second hologram corresponding to the first alignment mark, a reference wave irradiation optical system for irradiating the coherent beam from the light source as a reference wave for formation of the second hologram onto the hologram recording medium so as to interfere with the second object wave in the hologram recording medium, a reconstruction wave irradiation optical system for irradiating a wave conjugate with the reference wave as a second reconstruction wave onto the second hologram formed in the hologram recording medium and irradiating reconstruction light produced from the second hologram upon irradiation of the second reconstruction wave onto the surface of the substrate, reconstruction image measurement means for measuring a reconstruction condition of an image of the first alignment mark formed on the surface of the substrate with the reconstruction light, and relative position detection means for detecting information of relative displacement between the hologram recording medium and the substrate in accordance with a result of measurement of the reconstruction image measurement means.

According to a sixth aspect of the present invention, there is provided an exposure apparatus which includes, in order to reproduce a pattern of a mask onto a photosensitive surface of a substrate making use of a holographic technique, means for causing a first object wave derived from transmission diffraction light from the mask pattern and a reference wave of coherent light to interfere with each other to record a first hologram of the mask pattern onto a hologram recording medium, and means irradiating a first reconstruction wave conjugate with the reference wave onto the first hologram to reconstruct an image of the mask pattern onto the photosensitive surface of the substrate arranged in place of the mask, comprising:

a coherent light source for generating a coherent beam, an object wave irradiation optical system for introducing the coherent beam from the light source to a position of the mask at which a first alignment mark is formed and irradiating transmission diffraction light produced from the first alignment mark illuminated with the coherent beam onto the hologram recording medium as a second object wave for formation of a second hologram corresponding to the first alignment mark, a reference wave irradiation optical system for irradiating the coherent beam from the light source as a reference wave for formation of the second hologram from the opposite side to the mask so as to be totally reflected by an inner surface of the hologram recording medium and interfere with the second object wave in the hologram recording medium, a reconstruction wave irradiation optical system for irradiating a wave conjugate with the reference wave as a second reconstruction wave onto the second hologram formed in the hologram recording medium and irradiating reconstruction light produced from the second hologram upon irradiation of the second reconstruction wave onto the surface of the substrate, reconstruction image measurement means for measuring a reconstruction condition of an image of the first alignment mark formed on the surface of the substrate with the reconstruction light, and relative position detection means for detecting information of relative displacement between the hologram recording medium and the substrate in accordance with a result of measurement of the reconstruction image measurement means.

According to a modification to the fifth or sixth aspect of the present invention, the reconstruction image measurement means detects, in order to measure a reconstruction condition of the first alignment mark, reflection light or transmission light from the surface of the substrate illuminated with the reconstruction light.

According to another modification to the fifth or sixth aspect of the present invention, the reconstruction image measurement means introduces, in order to measure a reconstruction condition of the first alignment mark, reflection light from the surface of the substrate illuminated with the reconstruction light to the second hologram and detects diffraction light produced from the second hologram illuminated with the reflection light.

According to a further modification to the aspects and the modifications described above, the exposure apparatus further comprises correction means for correcting a relative positional relationship between the hologram recording medium and the substrate in accordance with a result of detection by the relative position detection means.

According to a seventh aspect of the present invention, there is provided an exposure apparatus which includes, in order to reproduce a pattern of a mask onto a photosensitive surface of a substrate making use of a holographic technique, means for causing a first object wave derived from diffraction light from the mask pattern and a reference wave of coherent light to interfere with each other to record a first hologram of the mask pattern onto a hologram recording medium, and means irradiating a first reconstruction wave conjugate with the reference wave onto the first hologram to reconstruct an image of the mask pattern onto the photosensitive surface of the substrate arranged in place of the mask, comprising:

a coherent light source for generating a coherent beam, an object wave irradiation optical system for introducing the coherent beam from the light source to a first alignment mark formed on the mask and irradiating diffraction light produced from the first alignment mark illuminated with said coherent beam onto the hologram recording medium as a second object wave for formation of a second hologram mark corresponding to the first alignment mark, a reference wave irradiation optical system for irradiating the coherent light from the light source as a reference wave for formation of the second hologram onto the hologram recording medium so as to interfere with the second object wave in the hologram recording medium, a reconstruction wave irradiation optical system for irradiating a wave conjugate with the reference wave as a second reconstruction wave onto the second hologram formed in the hologram recording medium and irradiating reconstruction light produced from the second hologram upon irradiation of the second reconstruction wave onto a second alignment mark formed on the surface of the substrate, image formation measurement means for measuring an image formation condition of reflection light or transmission light from the second alignment mark illuminated with the reconstruction light, and relative position detection means for detecting information of relative displacement between the hologram recording medium and a wafer in accordance with a result of measurement of the image formation measurement means.

According to a modification to the seventh aspect of the present invention, the second alignment mark has a predetermined pattern selected so that diffraction light is produced upon irradiation of the reconstruction light, and the image formation measurement means detects reflection diffraction light or transmission diffraction light produced from the second alignment mark illuminated with the reconstruction light.

According to another modification to the seventh aspect of the present invention, the second alignment mark has a pattern of the shape of a diffraction grating, and according to a further modification, the second alignment mark has a pattern of the shape of a zone plate.

According to a still further modification to the seventh aspect of the present invention, the exposure apparatus further comprises correction means for correcting a relative positional relationship between the hologram recording medium and the substrate in accordance with a result of detection by the relative position detection means.

According to an eighth aspect of the present invention, there is provided an exposure apparatus which includes, in order to reproduce a pattern of a mask onto a photosensitive surface of a substrate making use of a holographic technique, means for causing a first object wave derived from diffraction light from the mask pattern and a reference wave of coherent light to interfere with each other to record a first hologram of the mask pattern onto a hologram recording medium, and means irradiating a first reconstruction wave conjugate with the reference wave onto the first hologram to reconstruct an image of the mask pattern on the photosensitive surface of the substrate arranged in place of the mask, comprising a coherent light source for generating a coherent beam, an object wave irradiation optical system for introducing the coherent beam from the light source to a first alignment mark formed on the mask and irradiating transmission diffraction light produced from the first alignment mark illuminated with the illumination light onto the hologram recording medium as a second object wave for formation of a second hologram mark corresponding to the first alignment mark, a reference wave irradiation optical system for irradiating the coherent light from the light source as a reference wave for formation of the second hologram onto the hologram recording medium so as to interfere with the second object wave in the hologram recording medium, a wafer mark illumination optical system for introducing illumination light of a wavelength equal to that of the second object wave to a second alignment mark formed on the surface of the substrate and introducing diffraction light produced from the second alignment mark illuminated with the illumination light onto the second hologram formed in the hologram recording medium;

transmission light measurement means for measuring transmission light produced from the second hologram illuminated with the diffraction light from the second alignment mark, and relative position detection means for detecting information of relative displacement between the hologram recording medium and the substrate in accordance with a result of measurement of the transmission light measurement means.

According to a modification to the eighth aspect of the present invention, the first alignment mark has a zone plate pattern, and the second alignment mark has a pattern of the shape of a zone plate selected so as to produce a same diffraction wave as the object wave from the first alignment mark.

According to another modification to the eighth aspect of the present invention, the exposure apparatus further comprises reference reflection light detection means for introducing reference inspection light equivalent to the second reference wave to the second hologram and detecting reflection light of the reference inspection light from the second hologram, the relative position detection means making use of a result of detection of the reflection light detection means to detect information of relative displacement between the hologram recording medium and the substrate.

According to a further modification to the eighth aspect of the present invention and the modifications to the eighth aspect, the exposure apparatus further comprises correction means for correcting a relative positional relationship between the hologram recording medium and the substrate in accordance with a result of detection by the relative position detection means.

In the present invention, it is characteristic that, upon alignment operation between a hologram (recording medium) and a substrate (wafer) which is performed prior to holography exposure (hologram reconstruction) of a mask pattern, an alignment operation which still makes use of a holographic technique is performed.

In particular, in the present invention, alignment is performed making use of the fact that, if the condition of a reconstruction image of a first alignment mark (called mask mark) produced by holography is appropriate, then also a reconstruction image from a first hologram of a mask pattern formed on the same hologram recording medium has a similar good reconstruction condition, and thereafter, exposure of the mask pattern (hologram reconstruction) is performed.

In other words, if a first hologram (corresponding to a mask pattern) and a second hologram (corresponding to a mask mark) recorded on the same hologram recording medium are reconstructed on the mask from the same mask, reconstruction images of them are formed, on the surface of a wafer, as individual images which maintain the relative positional relationship between the mask pattern and the mask mark. In the present invention, making use of this principle, the relative positional relationship between the hologram recording medium and the wafer is adjusted so as to achieve an appropriate condition wherein the reconstruction condition of the image of the second alignment mark (called wafer mark) formed on the wafer or an image of the second hologram at a position at which the wafer mark should be present coincides with a predetermined requirement, and consequently, when it is tried to expose the mask pattern by holographic exposure to the wafer, alignment between the wafer and the first hologram is established accurately.

For example, when it is optically measured that a reconstruction image at least of the second hologram is reconstructed in an accurately focused condition, this signifies that an appropriate gap (the direction of the gap will be referred to as Z direction) for providing an appropriate reconstruction image on the surface of the wafer is formed between the hologram recording medium and the wafer, and accordingly, by utilizing this, alignment of the gap, which is one of variables of the relative positional relationship between the wafer and the hologram recording medium, is performed.

Meanwhile, by measuring the reconstruction condition of an image of the second hologram at a particular position at which the second alignment mark should be present on the wafer and adjusting the relative positional relationship between the wafer and the hologram recording medium so that the reconstruction image at the particular position may have an appropriate condition, alignment in two perpendicular directions (called X and Y directions) in a plane perpendicular to the Z direction is performed. In particular, where means for detecting reconstruction light from the second hologram is provided, for example, only at the particular position on the wafer, if some relative displacement in the X and/or Y directions is involved, reconstruction light from the second hologram is not detected, and accordingly, it is recognized that the relative position between the wafer and the hologram recording medium should be adjusted so that such reconstruction light may be detected appropriately.

Further, by providing the second alignment mark (wafer mark) of the shape of a predetermined pattern at the particular position on the wafer and measuring the reconstruction condition of an image of the second hologram on the wafer mark, adjustment of the relative position in the X and/or Y directions can be performed by adjusting the relative positional relationship between the image and the wafer mark. For example, where means for detecting reconstruction light from the second hologram via the wafer mark is provided, if some relative displacement in the X and/or Y directions is involved, reconstruction light from the second hologram is not irradiated upon the wafer mark and the detection means fails to detect the reconstruction light, and accordingly, alignment can be achieved by adjusting the relative position between the wafer and the hologram recording medium so that the reconstruction light may be detected appropriately by the detection means.

The means for detecting reconstruction light from the second hologram is not limited to a specific one if it can detect that the reconstruction condition of a reconstructed hologram image is appropriate. For example, since the reconstruction light is diffraction light which converges at the reconstruction image forming position, means for detecting the intensity of transmission light or reflection light on the surface of the wafer of the reconstruction light so that the converging condition (intensity) of the reconstruction light on the surface of the wafer may be in the maximum may be used, or also means for observing a reconstruction image formed on the surface of the wafer with the reconstruction light simply as an image may be used.

In addition, by performing detection of the relative position at a plurality of positions on the wafer, also adjustment of the relative position between the wafer and the hologram recording medium in terms of an inclination or a rotational error can be performed. It is to be noted that the means for detecting such relative positional relationship may perform detection of the relative position in terms of the gap and the X-Y direction position simultaneously or individually.

Here, in the holographic technique, a hologram is formed with diffraction light from a mark of a predetermined shape or pattern, and an image of the mark is reconstructed with diffraction light from the hologram. Consequently, diffraction light from the mark and the hologram is important for formation and reconstruction of the hologram. In the present invention, paying attention to the characteristic of diffraction light in the holographic technique, there is a characteristic in that the relative positional relationship between a wafer and a hologram recording medium is detected and corrected making use of various characteristics of diffraction light produced from a mask mark, a second hologram and a wafer mark.

For example, a second object wave which is produced from a mask mark when it is tried to form and record a second hologram corresponding to the mask mark in a recording medium is diffraction light diffracted under a diffraction condition which depends on the shape or pattern of an alignment mark of the mask, and a reconstruction wave from the hologram formed with the object wave follows the route to that of the object wave but in the opposite direction and is converged at an image forming position to form an image of the alignment mark.

Further, if diffraction light same as the object wave is irradiated onto the hologram thus formed, then part of the diffraction light is diffracted by the hologram while the remaining part passes through the hologram. Since the light beam diffracted by the hologram is substantially capable of interfering with the reference wave used for formation of the hologram, it traces the same path as that of the reference wave used on recording of the hologram.

Consequently, where a wafer mark of a pattern shape which produces diffraction light similar to the object wave is formed on the wafer, diffraction light or a diffraction wave which is produced when a beam of an equal wavelength to that of the object wave is irradiated upon the wafer mark exhibits similar behavior to that of the object wave. The condition wherein a diffraction wave from the wafer mark traces the same path as that of the reference wave is a condition wherein a diffraction wave from the wafer mark advances along the path in the opposite direction to that of a reconstruction wave for an image of the alignment mark, and this condition is a condition in which a holograph image of the second alignment mark is to be reproduced accurately on the wafer mark.

Here, since the condition wherein a hologram image of the first alignment mark is formed accurately on the wafer mark is an accurately positioned condition between the wafer and the hologram recording medium, by detecting the advancing condition of a diffraction wave from the wafer mark (such as, for example, an optical intensity distribution in a plane perpendicular to an optical axis of the diffraction wave), the reproduction condition of the alignment mark, that is, the relative displacement condition between the wafer and the hologram recording medium, can be measured.

In this manner, in the present embodiment, upon detection of the relative positional relationship between the wafer and the hologram recording medium, a diffraction wave from the wafer mark can be utilized as detection light to measure a manner of registration such as an advancing condition of a reference wave and the diffraction light with respect to the hologram.

It is to be noted that the relative positional relationship between the mask mark (first alignment mark) and the mask pattern on the mask naturally corresponds to the relative positional relationship between the wafer mark (second alignment mark) and the mask pattern image formation region (exposure region) on the wafer.

While the present invention is suitably applied to an exposure system which employs so-called total internal reflection holography wherein total internal reflection light in a hologram recording medium placed on a prism of a predetermined profile is utilized for recording and/or reconstruction of a hologram, it can naturally be applied to exposure systems which employ other types of holographiy.

In the present invention, a second hologram for alignment operation is formed on a hologram recording medium from a mask mark (first alignment mark) provided on a mask, and reconstruction light from the second hologram is utilized for detection of a relative positional error between the recording medium and a wafer in an alignment operation. The reconstruction light is irradiated onto a wafer mark (second alignment mark) formed on a wafer. The irradiation condition of the reconstruction light on the wafer mark (the reconstruction condition of an image of the first alignment mark reconstructed from the second hologram) is detected by detecting one of a beam which has passed through the wafer mark and another beam which has been reflected from the wafer mark. By measuring a beam coming from the wafer mark, the relative displacement condition between the wafer and the hologram recording medium, that is, between the exposure region on the wafer and the first hologram recorded on the hologram recording medium, is detected, and further, adjustment (correction movement) of the relative positional relationship between them is performed to establish alignment.

In the alignment operation, reconstruction light (diffraction light) from the second hologram is utilized for detection upon detection of information of relative displacement between the hologram recording medium and the wafer, and the reconstruction light is capable of converging at a certain fixed image forming position. Therefore, the reconstruction condition of the first alignment mark image on the surface of the wafer can be detected by detecting the converging condition (image forming condition) of the reconstruction light. Accordingly, when an image of the first alignment mark located at a predetermined position with respect to the mask pattern is formed on the wafer by utilization of the holographic technique, the converging condition of the reconstruction of how much and in which direction the image of the first alignment mark is displaced from the wafer mark (second alignment mark) provided in advance on the wafer is detected in connection with the position of the wafer mark on the surface of the wafer, and as a result, the relative displacement condition between the wafer and the hologram recording medium, that is, between the exposure region on the wafer and the first hologram recorded on the hologram recording medium, is detected.

In this manner, in the present invention, the holographic technique is utilized also for the alignment operation, and the conditions (variations) of the wave front, the intensity and so forth of alignment measurement light based on the relative positional relationship between the wafer and the hologram recording medium are measured making use of characteristics such as a diffraction direction of a diffraction wave from the hologram of the alignment mark or characteristics of reconstruction light for forming a hologram reconstruction image. Then, in accordance with a result of the measurement, a relative positional error between the exposure region on the wafer and the first hologram recorded on the hologram recording medium is measured, and a precise alignment operation is achieved by correcting the relative positional error.

Since an alignment operation in the present invention is achieved making use of the holographic technique, there is no necessity of observing a pattern itself of an alignment mark. Consequently, such a pattern observation optical system as in the prior art is not necessary, and the alignment mark can be made very fine. Further, also enhancement of the accuracy of the alignment can be anticipated.

One of such reasons is that, since, in the present invention, reconstruction light diffracted by the hologram of the alignment mark is utilized for measurement of the relative position, it is less liable to be influenced by multiple reflection, irregular reflection or the like, and the measurement light itself includes little noise. Further, taking the measurement accuracy of a wafer mark into consideration, also the construction of the wafer mark is preferably such that a diffraction wave having a predetermined characteristic is obtained by irradiation of the reconstruction light, and enhancement of the measurement accuracy can be further anticipated by using such reconstruction light diffracted by the wafer mark for measurement.

Further, in the present invention, transmission light (including transmission diffraction light) or reflection light (including reflection diffraction light) from the wafer mark illuminated with the reconstruction light is measured, and one of transmission light and reflection light should be selected depending upon the characteristic (transparent or not) of the material constituting the wafer or the arrangement construction of the measurement optical system. For example, where the wafer is formed from a glass substrate, using a mark drawn as a wafer mark on the substrate by electron beam direct-write lithography, transmission light having passed through the proximity of the mark or transmission diffraction light from the mark is measured. On the other hand, where the substrate is opaque, reflection light, reflection diffraction light or the like from the proximity of the wafer mark is measured.

Further, in the holography, when a reference wave is irradiated upon a hologram recorded on a recording medium similarly as upon recording of the hologram, in addition to a beam which advances along the same path as that of the reference wave used for recording of the hologram, a diffraction wave is produced which is diffracted by the hologram and advances along the same path as that of the object wave used for recording of the hologram. This characteristic can be utilized for detecting information of relative displacement between the wafer mark and the second hologram when diffraction light from the wafer mark is to be measured, and in this case, the second hologram is illuminated with a same beam as the reference wave to produce a light beam which is to be utilized as a reference light, thereby measuring the relative positional relationship between the reference light and the diffraction wave from the wafer mark.

The first or second alignment mark used in the present invention may have, for example, a zone plate pattern of a linear profile or a concentrical circular zone plate pattern which is designed so that the focal length may be equal to the gap between a hologram and a mask or a substrate in response to the wavelength of a beam from a light source. In particular, where the first alignment mark of a mask or the second alignment mark of a wafer has a zone plate pattern, a convergent or divergent diffraction wave can be utilized for measurement light for alignment. In this manner, if the system is constructed such that measurement of a diffraction wave is principally performed making use of a diffraction action based on a zone plate for measurement of the relative positional relationship between a hologram recording medium and a substrate for alignment operation, then an influence and so forth of noise light which is produced on the surface of the wafer or the surface of the hologram recording medium can be eliminated, and measurement of the relative positional relationship can be achieved readily and accurately only by detecting a converging (image forming) point of measurement light.

In the present invention which utilizes a holographic technique for measurement of the relative position between a wafer and a hologram recording medium, when a reconstruction wave is irradiated in a predetermined direction upon a hologram (second hologram) of a first alignment mark, reconstruction light (a diffraction wave) produced from the hologram converges at an image forming position peculiar to it. Accordingly, a reconstruction image (image of the first alignment mark) of the second hologram is formed at the image forming position, and consequently, if the hologram reconstruction image is formed in an accurately focused condition on the surface of the wafer, the light converging condition of the image formed is a least defocused condition.

As regards, for example, detection of the gap between the wafer and the hologram recording medium, the condition wherein the detection intensity from a hologram reconstruction image on the surface of the substrate presents its maximum level is a condition wherein the reconstruction light forms an image (converges) accurately on the wafer. Since this condition is a condition wherein the gap between the wafer and the hologram recording medium is positioned accurately at the focusing position of the hologram reconstruction light, if the alignment operation is performed so that the detection intensity may present its maximum, an accurate positioning operation for the gap can be achieved.

Meanwhile, as regards alignment in two perpendicular directions parallel to the surface of the wafer, that is, in the x and y directions, if mask marks or wafer marks are formed, for example, in the form of elongated patterns relatively long in the x or y direction or in the form of a plurality of small patterns arranged in the x or y direction and the positional relationship between them is measured using a holographic technique, then positioning is performed.

Further, while it is possible to adopt a system substantially similar to the system for position detection which is known in a conventional alignment method for an exposure projection apparatus for detecting relative displacement information based on the measurement of a diffraction wave described above, the exposure apparatus in accordance with the present invention adopts a method different from the conventional method in that it makes use of holography. Further, in the alignment method according to the present invention, the relative positional relationship between a wafer mark and a second hologram can be measured also by designing the wafer mark appropriately in terms of the arrangement position, the orientation and the profile and additionally performing scanning (for example, mechanical scanning or oscillation scanning) of illumination light which illuminates the second hologram of the master mark for generation of a diffraction wave, and a further accurate alignment operation can be achieved if correction of the relative position is performed in accordance with a result of the measurement.

According to the present invention, since a first hologram of a mask pattern and a second hologram of a mask mark are recorded on a same hologram recording medium and the second hologram is utilized for measurement of the relative positional error between the first hologram and an exposure region on a wafer, even if the hologram recording medium suffers from such deformation as contraction, the positional relationship between the first hologram and the second hologram in regard to the image forming position of a reconstruction image of the hologram is kept substantially fixed, and any variation of the image forming position by deformation of the hologram is automatically corrected.

In holography exposure, since exposure of a mask pattern is performed to a wafer with a reconstruction image of a hologram, individual reconstruction images from a plurality of holograms formed in a particular mutual positional relationship on a same hologram recording medium are reconstructed at positions having the positional relationship described above with each other not only in holography exposure of the so-called total internal reflection type but also in holography exposure of any other type. In order to establish alignment between a first hologram of a hologram recording medium and an exposure region on a wafer using the characteristic just described, the following steps are required.

That is, it is required as a first step to record, for example, a second hologram as a hologram mark for alignment purpose onto a hologram recording medium with diffraction light from a first alignment mark formed on a mask. In this recording step, the second hologram corresponding to the first alignment mark of the mask is recorded onto the same hologram recording medium for the first hologram corresponding to the mask pattern. Another recording step for the first hologram corresponding to the mask pattern is performed while the relative positional relationship between the mask and the hologram recording medium used in the recording step of the second hologram is maintained. It is to be noted that these hologram recording steps may be performed in either of the opposite orders.

Subsequently, prior to reconstruction of an image of the mask pattern, it is required for next step to irradiate the wafer with reconstruction light obtained by irradiation of the second hologram with a reconstruction wave and to measure the reconstruction condition of an image of the first alignment mark on the surface of the wafer with the reconstruction light. In this step, the reconstruction image of the first alignment mark is formed on the wafer surface, and the relative positional relationship between the hologram recording medium and the wafer can be measured as described above by measuring the reconstruction condition of the reconstruction image on the surface of the wafer. Since this step is performed as an alignment operation for reconstruction of the mask pattern, it is performed before reconstruction of an image of the mask pattern from the first hologram. It is to be noted that, in order to prevent an exposure region of the wafer from being sensitized unnecessarily during alignment, the exposure region of the wafer must necessarily be shielded against light in advance by some means.

Thereafter, further steps are performed in which the information of the relative position between the hologram recording medium and the wafer is detected in accordance with a result of the measurement and the relative positional relationship is corrected in accordance with the positional displacement information. As described above, by detecting whether or not the reconstruction condition of the second hologram is appropriate, presence or absence of relative displacement between the exposure region of the wafer and the first hologram can be discriminated. Further, the relative positional relationship between the wafer and the hologram recording medium is corrected in accordance with the displacement information so that the reconstruction condition of the second hologram may be appropriate, thereby completing the alignment operation. While appropriate alignment is established in this manner, the first hologram corresponding to the mask pattern is reconstructed, and consequently, an appropriate mask pattern image is exposed to the exposure region at a predetermined position on the surface of the wafer.

According to the second aspect of the present invention described above, in an exposure method which makes use of a holographic technique of the so-called total internal reflection type, a similar holographic technique of the total internal reflection type is utilized also for an alignment operation prior to exposure. In this instance, the first alignment mark provided on the mask has a predetermined mark pattern which is designed so that, when the first alignment mark is recorded as a second hologram on the hologram recording medium using the holographic technique, the second hologram may be a hologram in the form of a zone plate (hereinafter referred to as holographic zone plate).

In particular, in the present aspect, upon measurement of the relative positional relationship (including the gap between the hologram recording medium and the wafer) between the first hologram (corresponding to the mask pattern) of the hologram recording medium and the exposure region of the wafer, a holographic zone plate recorded on the hologram recording medium is utilized, and a beam (reconstruction light) which is produced from the holographic zone plate and converges (forms an image) at a particular image forming position is utilized. Information of the relative displacement between the first hologram and the exposure region of the wafer is measured from the converging condition (reconstruction condition) of the reconstruction light on the surface of the wafer. Detection of the converging condition is performed, for example, by detecting the intensity or a wave front of transmission light or reflection light from the surface of the wafer.

The formation of the second hologram from the first alignment mark is performed by a step at which the first alignment mark of the shape of a predetermined pattern formed on the mask is illuminated with coherent light and a holographic zone plate is recorded on the hologram recording medium using transmission diffraction light, which is produced from the first alignment mark upon illumination of the first alignment mark with the coherent light, as an object wave. The step of formation of the second hologram is performed in a similar manner as upon recording of the mask pattern using divergent light diffracted by the pattern of the first alignment mark provided on the mask.

The shape of the pattern of the first alignment mark may be any pattern shape only if the second hologram which is to be formed by holographic recording from the first alignment mark has a function as a holographic zone plate. It is to be noted that the function of a holographic zone plate depicts a function of producing reconstruction light which converges, when a hologram is irradiated with a reconstruction wave, from the hologram at the image forming position peculiar to the hologram. Such hologram is here referred to as holographic zone plate.

While the shape of the pattern of the first alignment mark which provides such holographic zone plate may be, for example, a slit, a pin-hole or the like as a simplest example, naturally it is not limited to the specific one, and such a pattern shape may be applicable that transmission diffraction light produced from the first alignment mark illuminated may make divergent light. It is to be noted that, in case the first alignment mark is formed from a pin-hole, a concentrical graphic zone plate is formed as the second hologram, but in case the first alignment is formed from a slit, a holographic zone plate of a striped pattern formed from a plurality of stripes is formed.

The step of formation of a holographic zone plate can be performed simultaneously with or separately from the step of formation of the hologram of the mask pattern. Further, upon formation and reconstruction of a holographic zone plate, light of a wavelength different from the wavelength of light used upon formation or reconstruction of the hologram of the mask pattern may be used.

Subsequently to the steps described above, prior to reconstruction of the mask pattern image, a reconstruction wave is irradiated upon the holographic zone plate, and the surface of the wafer is irradiated with reconstruction light which is produced from the holographic zone plate upon such irradiation of the reconstruction wave. Reflection light or transmission light from the surface of the wafer irradiated with the reconstruction light is detected to measure the condition of a reconstruction image (image of the first alignment mark) of the holographic zone plate with the reconstruction light on the surface of the wafer. Further, information of relative displacement between the wafer and the hologram recording medium is detected in accordance with a result of the measurement, and the relative positional relationship between them is corrected in accordance with the displacement information, thereby completing the alignment operation.

In this instance, since a holographic zone plate is utilized as the second hologram for an alignment operation, the reconstruction light produced from the holographic zone plate becomes a beam which converges at an image forming position peculiar to it. Consequently, as regard, for example, the gap, since the condition in which the reconstruction light converges accurately on the surface of the wafer is a condition wherein an image of the first alignment mark is reconstructed accurately, the reconstruction condition of an image of the first alignment mark can be detected by detecting the converging condition of reconstruction light on the surface of the wafer.

Further, by performing the detection described above at a predetermined position on the wafer, also the displacement condition in the X–Y directions can be detected simultaneously from the relative displacement condition between the predetermined position and the converging position of reconstruction light, and if this is detected at a plurality of positions on the surface of the wafer, then also the relative displacement condition in terms of an inclination, a rotational error and so forth can be detected.

Further, paying attention to the fact that the reconstruction light is a diffraction wave diffracted by a holographic zone plate, also the light converging condition on the surface of the wafer can be detected by detecting a wave front of reflection light or transmission light from the surface of the wafer irradiated with the reconstruction light. In an example of relative position measurement by such wave front detection, reflection light from the surface of the wafer irradiated with reconstruction light from a holographic zone plate is introduced into the holographic zone plate again, and a wave front of transmission diffraction light produced from the holographic zone plate irradiated with the reflection light is detected to measure the reconstruction condition of an image of the first alignment mark on the surface of the wafer.

In this instance, if a reflection portion is provided, for example, at a reconstruction light irradiation position on the surface of the wafer, then not only the gap but also displacement in the X–Y directions and so forth can be detected in a similar manner as described above.

Since reconstruction light of an image of the first alignment mark produced from the holographic zone plate converges at a peculiar image forming position as a wave diffracted from the holographic zone plate as described above, if the reconstruction light is reflected by the surface of the wafer, then this makes divergent light conversely. In other words, reflection light from the surface of the wafer becomes divergent light from an image of the alignment mark formed on the surface of the wafer, and the divergent light enters the holographic zone plate again.

If the gap between the wafer and the hologram recording medium is accurate and the reconstruction light is focused on the surface of the wafer, then the reconstruction condition of an image of the first alignment mark on the surface of the wafer can be measured as a same image as the first alignment mark is formed on the surface of the wafer. Then, reflection light from the surface of the wafer (a beam from an image of the alignment mark) follows the path (the same path as that of divergent light from the first alignment mark upon formation of the second hologram) of the opposite direction to that of convergent light upon image formation so that it enters the holographic zone plate as reflection divergent light again.

The reflection divergent light having entered the holographic zone plate is diffracted by the holographic zone plate, and here, a characteristic of the holographic technique appears in the advancing direction of the diffraction light. In particular, while an object wave and (reflection light of) a reference wave interfere with each other, upon hologram recording, in the hologram recording medium, when a beam equivalent to the object wave used upon hologram recording is irradiated onto the hologram formed, the beam is diffracted by the hologram and advances along the same path as that of the reference wave (reflection light in the hologram recording medium) used upon recording of the hologram.

Since the light which follows the path of (reflection light of) the reference wave is a beam which advances along the route in the opposite direction to that of the reconstruction wave (parallel light conjugate with the reference wave) upon hologram reproduction, if the reconstruction image of the first alignment mark is in an accurately focused condition on the surface of the wafer, then reflection diffraction light by the holographic zone plate becomes parallel light which similarly follows the path in the opposite direction to that of the reconstruction wave.

On the other hand, when the image of the first alignment mark is not in an accurately reconstructed condition, that is, when the gap between the wafer and the hologram recording medium is not in an accurately positioned condition to a focused condition, reflection divergent light on the surface of the wafer is different from the object wave used upon hologram recording, and reflection diffraction light by the holographic zone plate becomes not parallel light but convergent or divergent light.

Consequently, by detecting a wave front (parallel, convergent or divergent) of the reflection diffraction light, displacement of the gap between the hologram (recording medium) and the wafer can be detected with respect to the difference between the hologram and the accurate formation position (focused position) of a reconstruction image of the hologram.

Meanwhile, as regards alignment of the gap, focusing (adjustment of the gap) of a reconstruction image of the hologram can be performed by detecting the displacement condition from the focused condition from a result of the detection of a wave front of the reflection diffraction light and correcting the relative distance between the wafer and the hologram recording medium in accordance with a result of the detection.

Further, if a reflection portion is provided at the formation position of an image of the alignment mark as described hereinabove, then since displacement information in the X–Y directions can be detected from presence or absence of such reflection light, it is also possible to correct the relative positional relationship between the program recording medium and the wafer other than the gap making use of the detection of a wave front of the reflection light. It is to be noted that it is also possible to detect, upon detection of a wave front, the intensity or the like simultaneously by means of the same detection system, and detection of the relative position, a correction adjustment operation and so forth may be performed in accordance with the information of the intensity and so froth.

According to a further aspect of the present invention, prior to reproduction of an image of a mask pattern, in an alignment operation for adjusting the relative positional relationship between a wafer and a hologram recording medium, a reconstruction wave is irradiated upon a second hologram formed on the hologram recording medium, and the surface of the wafer is irradiated with reconstruction light obtained from the second hologram upon irradiation of the reconstruction wave. Then, reflection light or transmission light from a wafer mark (second alignment mark) on the surface of the wafer irradiated with the reconstruction light is detected.

The reconstruction wave irradiated upon the second hologram is only required to be a wave which is conjugate with a reference wave which has been used for recording of the second hologram, and a diffraction wave (reconstruction light) is produced from the second hologram as a result of the irradiation of the reconstruction wave. The reconstruction light reconstructs an image of the first alignment mark at a position equivalent to the position at which the first alignment mark has been present upon recording of the second hologram.

As described hereinabove, the surface of the wafer arranged at the equivalent position in place of the mask is irradiated with the reconstruction light from the second hologram. In this instance, the irradiation condition, that is, the image forming condition of the reconstruction image on the surface of the wafer, is detected to measure the positional relationship between the wafer and the hologram recording medium. In this instance, since the wafer mark is provided at a predetermined position on the surface of the wafer for measurement of the relative positional relationship described above, not only the gap but also the relative position in the x–y direction and so forth can be measured by detecting the irradiation condition of the reconstruction light on the wafer mark.

The detection of the irradiation condition of the reconstruction light upon the wafer mark is performed at a step of detecting reflection light or transmission light from the wafer mark irradiated with the reconstruction light. In particular, also in this instance, reconstruction light (diffraction light) from the second hologram is utilized for measurement of the relative position between the wafer and the hologram recording medium.

If the condition wherein the wafer mark is irradiated accurately with the reconstruction light from the second hologram, that is, the condition wherein an appropriate reconstruction image of the first alignment mark is superposed accurately on the wafer mark, can be detected, it is recognized that relative positioning between the hologram recording medium and the wafer is accurate, or otherwise, it is recognized that an error is involved in such positioning.

For such recognition, reflection light or transmission light from the wafer mark irradiated with the reconstruction light is detected, and information (a condition) of the relative position between the hologram recording medium and the wafer is measured in accordance with a result of the detection. Finally, the relative positional relationship between the wafer and the hologram recording medium is corrected in accordance with a result of the measurement.

It is also effective to detect reflection diffraction light or transmission diffraction light from the wafer mark irradiated with the reconstruction light. In this instance, the wafer mark is formed in the shape of such a pattern that it produces diffraction light when it is irradiated with reconstruction light. Consequently, reflection light or transmission light to be detected upon measurement of the displacement information becomes diffraction light. When the reconstruction light is irradiated upon the wafer mark satisfying a predetermined irradiation requirement (which depends upon the relative positional relationship between the wafer and the hologram recording medium), diffraction light of a particular characteristic is detected, but when the relative positional relationship involves some displacement, the irradiation requirement is not satisfied, and consequently, the characteristic of diffraction light to be detected is different between the two cases. Accordingly, relative displacement information between the wafer and the hologram recording medium is obtained from the difference between characteristics of diffraction light detected.

The first alignment mark on the mask side which can be used in this instance may possibly be an alignment mark formed from a pin-hole or a slit. In particular, both of a pin-hole and a slit have a shape by which transmission diffraction light from the first alignment mark is made divergent light, and if a second hologram is formed using the transmission diffraction light as an object wave, then the second hologram is recorded as such a holographic zone plate as described hereinabove on the hologram recording medium.

In this instance, when a first alignment mark formed from, for example, a pin-hole, is used, a concentrical holographic zone plate is formed as a second hologram, but when another first alignment mark formed from a slit is used, another holographic zone plate of a striped pattern which occupies a linear belt-like region is formed. Reconstruction light from the second hologram of either form makes diffraction light which converges at a peculiar image forming position.

Meanwhile, it is also possible to record a first alignment mark on a hologram recording medium using convergent diffraction light as an object wave. In this instance, using a mark of a zone plate pattern as the first alignment mark, the hologram recording medium is irradiated with such convergent diffraction light as converges at a focus position through the mark. If a second hologram is formed with the object wave, where a first alignment mark formed from, for example, a concentrical zone plate is used, a second hologram of a concentrical configuration is still formed as a second hologram, but when another alignment mark formed from a linear striped zone plate is used, a linear hologram is formed as a second hologram.

Further, if the focal length of the first alignment mark of the zone plate type based on the wavelength employed is made equal to the distance of the gap between the mask and the hologram, then the object wave used upon formation of the hologram becomes an object wave which converges at a predetermined recording position in the hologram recording medium, and also the second hologram is formed in a line pattern or a dot pattern.

In the alignment operation, diffraction light (reconstruction light) produced from the second hologram irradiated with a reconstruction wave is utilized for detection. As described hereinabove, if it can be detected that the second alignment mark provided on the surface of the wafer is irradiated accurately with the reconstruction light, then measurement of the relative positional relationship can be performed. Then, by correcting the relative position between the wafer and the hologram recording medium in accordance with the measurement information and thereafter forming, while this condition is maintained, a reconstruction image of the first hologram on the surface of the wafer, the mask pattern is exposed accurately at an appropriate position on the wafer.

In the alignment operation, when, for example, the second hologram formed from the holographic zone plate produced at the preceding step is irradiated with the reconstruction light, an image (for example, a pin spot) of the first alignment mark is reconstructed on the wafer mark. In this instance, if the wafer mark has a pattern which produces diffraction light having a particular characteristic, such as, for example, a diffraction grating pattern or the like, then if, for example, primary diffraction light from the wafer mark is detected, upon measurement, in a predetermined direction, then the irradiation condition of the reconstruction upon the wafer mark, that is, the reconstruction condition of an image of the first alignment mark, can be measured.

According to the present measurement, there is an advantage in that information of an error in superposition between the reconstruction image of the first alignment mark and the wafer mark and information of the relative displacement of the gap from the diffraction direction and/or intensity of diffraction light produced from the wafer mark are obtained at a time. In other words, in this instance, whether or not an image of the first alignment mark is reconstructed appropriately on the wafer mark or how much the amount of the displacement of the image is can be detected making use of the characteristic of diffraction light, and the relative positional relationship between the wafer and the hologram can be acquired as three-dimensional information by measurement by once.

For example, where some relative displacement in the X–Y directions is present between the wafer and the hologram recording medium, the reconstruction light from the second hologram impinges upon a position on the surface of the wafer displaced from the wafer mark, and consequently, detection light of a predetermined characteristic cannot be obtained. On the other hand, also where the reconstruction light irradiates the wafer mark, if the gap between the wafer and the hologram recording medium involves some displacement, the detection light becomes different in terms of the intensity, a wave front and so forth comparing with the condition wherein the gap is positioned accurately. By measuring the characteristic of the detection light in this manner, the relative positional relationship between the hologram recording medium and the wafer is measured in a stationary condition.

According to a yet further aspect of the present invention, in an alignment operation, a second alignment mark (wafer mark) provided on the surface of a wafer is irradiated with illumination light of a wavelength equal to that of an object wave which has been used for recording of a second hologram, and a diffraction wave produced from the wafer mark as a result of the irradiation of the illumination light is irradiated onto a hologram recording medium. Simple or diffracted transmission light is produced with the diffraction wave from the second hologram formed on the recording medium, and the transmission light is measured for detection of the relative positional relationship between the hologram recording medium and a wafer.

In particular, as described hereinabove, when a reconstruction wave is introduced, for reconstruction of a hologram on which an object is recorded, into the hologram, a reconstruction beam diffracted by the hologram becomes a convergent beam which advances from the hologram toward a particular image forming position along a particular optical path. The optical path coincides with an optical path of the object wave used upon recording of the hologram if the advancing direction of light is reversed, and the image forming position coincides with a position at which the object has been upon recording of the hologram.

Accordingly, if an illumination beam of a wavelength equal to that of the object wave used for recording of the hologram is introduced into the hologram from the position at which the object has been existed upon the recording step, then the beam diffracted by the hologram advances in the opposite direction along the same optical path as that of the reconstruction wave. In an alignment operation which makes use of this principle, a diffraction wave which reversely follows the optical path of the object wave produced from the first alignment mark upon recording of the second hologram is produced from the wafer mark illuminated with the illumination light. The wavelength of the illumination light is equal to that of the object wave, and a diffraction wave from the wafer mark illuminated with the illumination light irradiates the second hologram. Transmission light produced from the second hologram mark as a result of the illumination of the illumination light is detected for measurement of the relative positional relationship between the wafer and the hologram recording medium, that is, between the wafer mark and the second hologram.

When the second hologram is irradiated with the diffraction wave, part of the diffraction wave is diffracted by the second hologram while the other part of the diffraction wave passes as it is through the second hologram. Accordingly, the transmission light to be detected is either transmission diffraction light diffracted by the second hologram or simple transmission light.

Measurement of the relative position based on a result of such detection may be such that, when, for example, transmission diffraction light from the second hologram is detected, detection means is arranged at a position corresponding to an exit position of the reconstruction wave upon ordinary reconstruction of the hologram to detect a beam which has followed the same optical path as that of the reconstruction wave but in the opposite direction and has been diffracted by the second hologram. In this instance, if it can be confirmed from a result of the detection of a wave front or the like of the detection light that the detection light advances accurately in the opposite direction along an optical axis of the optical path, then it is recognized that the wafer mark is positioned accurately with respect to the second hologram.

It is to be noted that, while the wafer mark preferably has a same construction as the first alignment mark, they need not necessarily be identical with each other. The second alignment mark, that is, the wafer mark, is only required to have such construction that, when the wafer mark is illuminated with the illumination light described above, a diffraction wave from the wafer mark advances along the same optical path as that of the object wave diffracted by the first alignment mark upon recording of the second hologram but in the opposite direction.

It is to be noted that, since the first alignment mark is formed on the mask, it can be constructed so as to produce an object wave from transmission or reflection diffraction light, but even if a first alignment mark of the transmission type is employed, the second alignment mark may be a mark of the transmission type or the reflection type. When it is tried to produce, for example, a liquid crystal display panel or the like, a transparent substrate is employed in most cases, and the second alignment mark in this instance may be constituted from a mark of the transmission type or the reflection type. Meanwhile, an opaque substrate (wafer) is used in most cases for production of, for example, semiconductor devices, and the second alignment mark (wafer mark) in such an instance may be constituted from a mark of the reflection type from which a diffraction wave advancing in the opposite direction along the same optical path as that of the object wave as a result of reflection can be obtained.

The first alignment mark may be an alignment mark of such a zone plate pattern as described hereinabove, and the second alignment mark in this instance has a construction which produces a diffraction wave equivalent to the object wave produced form the first alignment mark of the zone plate pattern upon recording of the second hologram when the second alignment mark is irradiated with the illumination light described above.

In such alignment operation, it is particularly preferable to form the first alignment mark from a zone plate pattern. This is because, if a zone plate is used for the mark, then since diffraction light produced from the mark becomes convergent light, detection of the position of the optical axis of the diffraction light can be performed readily and accurately.

In order to apply a zone plate to the first alignment mark, the construction of the zone plate is adapted to the wavelength used and the value of the gap so that the object wave produced from the second alignment mark upon recording may become diffraction light which converges on the hologram recording medium. For example, if the first alignment mark is constituted, for example, from a linear striped zone plate pattern, then a second hologram of a linear shape is recorded on the recording medium with an object wave from the first alignment mark. Then, if the second alignment mark (wafer mark) is constructed as a similar linear zone plate pattern, also a diffraction wave from the wafer mark becomes a beam which converges toward the hologram recording medium.

If the wafer and the hologram recording medium are in an accurately positioned condition, then the diffraction wave converges upon the second hologram in the form of a linear hologram, and since also diffraction light from the second hologram becomes convergent light which forms an image in the form of a linear zone plate, detection of the diffraction light can be performed readily and accurately.

Separately from this, such construction may be available that an object wave or a detection wave from the zone plate converges not upon the hologram recording medium but upon some other position, and in this instance, the relative positional relationship between the wafer and the hologram can be detected by measuring the position of the converging point in relation to a predetermined reference position. For example, where a first alignment mark and a wafer mark in the form of zone plates are used, the condition wherein diffraction light from the wafer mark converges at the same position as the position at which diffraction light (an object wave) from the first alignment mark converges is a condition wherein the wafer and the hologram recording medium are positioned accurately. In this instance, detection of the relative positional relationship should detect a converging point of a diffraction beam from the wafer mark which has simply passed through (not diffracted by) the second hologram.

Further, the first alignment mark and the wafer mark may be modified such that, for example, one of them is a continuous linear mark while the other is an intermittently cut mark so that detection of X–Y alignment can be achieved readily. In particular, they need not necessarily have a generally same profile, and if they have partially corresponding profiles, a diffraction wave equivalent to the object wave can be obtained as detection light.

In accordance with the information of the relative positional relationship (displacement amount, displacement direction and so forth) obtained from such measurement information as described above, the relative displacement condition between the hologram recording medium and the wafer, that is, between the exposure region on the wafer and the first hologram, is corrected, thereby completing the alignment. In the accurately positioned condition in this manner, the mask pattern is exposed onto the wafer by reconstruction of the first hologram. In this instance, since such an alignment step as described above has been performed, even in the case of superposition exposure including a plurality of exposure operations, accurate exposure can be performed.

According to a yet further aspect of the present invention, in an alignment operation, the second hologram is irradiated with reference inspection light equivalent to the reference wave used upon recording of the second hologram, and reference detection light produced from the second hologram as a result of the illumination of the reference inspection light is detected for measurement of information of the relative displacement between the hologram recording medium and the wafer.

In particular, a beam equivalent to the reference wave used upon recording of the hologram is irradiated onto the hologram formed, and thereupon, the characteristic of the beam produced from the hologram is utilized for measurement of alignment. When a beam equivalent to the reference wave used upon recording of the hologram is irradiated onto the hologram, part of the beam advances (is transmitted or reflected) similarly as upon recording of the hologram, but the other part of the beam is diffracted by the hologram.

The transmission or reflection light of the reference detection light produced from the hologram irradiated with the reference inspection light which advances in a similarly manner as upon recording of the hologram makes a beam which advances in the opposite direction along the path of the reconstruction wave (conjugate with the reference wave) for reconstruction of the hologram. Meanwhile, the other beam of the reference detection light diffracted by the hologram advances along the same path as that of the transmission light of the object wave irradiated onto the hologram upon recording.

Accordingly, in this instance, the diffraction light or transmission light from the hologram is an object for detection as detection light or transmission detection light, and it is detected whether or not the optical paths of the beams (but opposite in the advancing directions) coincide with the optical paths of the reconstruction wave or whether or not the focusing points of the light coincide with the focusing point of the object wave.

In this instance, under the conditions wherein the respective positions of the optical axes and the focusing points of both diffraction light produced from the second hologram irradiated with the diffraction wave and the reference detection light or of both transmission light from the second hologram irradiated with the diffraction wave and the reference detection light (diffraction light) are respectivelly coincide with each other, the wafer and the hologram recording medium, that is, the exposure region on the wafer and the first hologram, are positioned accurately.

While the exposure apparatus of the present invention using a holography technique is suitably applied to an exposure apparatus using so-called total internal reflection holography, the present invention can be applied also to another exposure apparatus using holography of any other type than total internal reflection holography.

According to an aspect of the present invention, an exposure apparatus for reproducing a pattern of a mask onto a photosensitive surface of a wafer using a holography technique comprises means for causing an object wave derivered from diffraction light from a desired pattern formed on the mask and a reference wave of coherent light to interfere with each other to record a first hologram onto a hologram recording medium, and means for irradiating a reconstruction wave conjugate with the reference wave onto the first hologram to reconstruct an image of the mask pattern onto the substrate arranged in place of the mask thereby reproducing the mask pattern onto the wafer. Specifically, the present apparatus is distinguished from conventional apparatus of the same type in that it further comprises alignment means which applies a holographic technique for detection of the relative position between the wafer and the hologram recording medium.

In particular, the exposure apparatus having alignment means comprises a coherent light source for generating a coherent beam as a light source for forming a second hologram for alignment purpose from a first alignment mark provided on the mask onto the hologram recording medium. The light source may be a common light source which is also used for production of the first hologram from the mask pattern or an individual light source other than one for the production of the first hologram (which may have a different wavelength). It is to be noted that, when the wavelength of the coherent light source is to be selected from within different wavelengths from the wavelength of the light source for recording of the first hologram, preferably a wavelength which does not substantially sensitize a photosensitive resist applied to the wafer is selected.

In particular, the wavelength of the coherent light to be used for recording of the second hologram onto the hologram recording medium need not necessarily be the same wavelength as that for the first hologram of the mask pattern, and the second hologram can be recorded with any wavelength to which the hologram recording medium is sensitive. If the second hologram is reconstructed with light of the same wavelength as that upon recording, then as far as the holography optical system upon reconstruction has equivalent conditions to those of the holography optical system used upon recording, an image of the first alignment mark to be reconstructed from the second hologram is reconstructed accurately at the position at which the original first alignment mark has been present. Alignment can be performed accurately if the present principle is utilized. In this instance, since the reconstruction image of the first alignment mark is formed accurately at the position at which the first alignment mark has been present upon recording of the second hologram, the image forming position of the reconstruction image of the second hologram does not vary even if a beam of a wavelength different from that for reconstruction of the mask pattern is utilized.

An alignment operation including measurement of the relative position between the wafer and the hologram recording medium is performed prior to exposure of the hologram of the mask pattern. Consequently, the problem sometimes occurs that, if an alignment operation is performed with light of an equal wavelength to that for reconstruction or recording of the mask pattern, then the photosensitive resist of the wafer is sensitized unnecessarily by the reconstruction light from the second hologram. In order to eliminate this problem, such a countermeasure is required as, for example, to separate the formation position of the first alignment mark of the mask sufficiently spatially from the formation position of the mask pattern or to shield the exposure region of the wafer against light upon alignment operation so that reproduction light (diffraction light or the like) from the second hologram may not have an influence upon the exposure region of the wafer to which the mask pattern is to be reproduced.

For an alignment operation, a coherent beam from the light source is irradiated onto the first alignment mark of the mask arranged with a predetermined gap left from the hologram recording medium. An object wave produced from the first alignment mark as a result of the irradiation of the coherent beam is irradiated onto the hologram recording medium by an object wave irradiation optical system, and also a reference wave obtained separately from the coherent light source is irradiated upon the hologram recording medium by way of a reference wave irradiation optical system. Consequently, the object wave and the reference wave interfere with each other in the hologram recording medium, and as a result, a second hologram corresponding to the first alignment mark is recorded on the hologram recording medium. The construction itself of the recording system for the second hologram is not particularly limited only if it makes use of a holographic technique, and it is required at least to include an optical system which introduces the beams of the object wave from the first alignment mark and the reference wave so that they may interfere with each other in the hologram recording medium.

In this instance, when the first alignment mark is irradiated with the object wave from the object wave irradiation optical system, diffraction light (an object wave) is produced from the first alignment mark, and the object wave is irradiated onto the hologram recording medium. Meanwhile, such a reference wave as interferes with the object wave in the hologram recording medium is irradiated from the reference wave irradiation optical system. A second hologram is formed in the hologram recording medium by a mutual interference between the object wave and the reference wave.

The first alignment mark may be formed on the mask together with a pattern to be reproduced, and after the mask is arranged with the predetermined gap left from the hologram recording medium, recording steps for the first hologram from the mask pattern and the second hologram for the first alignment mark are performed. Although the recording steps may be performed simultaneously or separately, in any case, it is essential that the relative positional relationship between the hologram recording medium and the mask be identical between the two recording steps. Subsequently to the recording steps, an additional operation for fixation of the first hologram and the second hologram is performed when necessary.

After the first hologram and the second hologram are recorded on the hologram recording medium in this manner, the mask is removed, and then a wafer is arranged instead at the position at which the mask has been. It is to be noted that the arrangement of the wafer is preferably positioned in a rough accuracy by a preliminary alignment operation. Thereafter, prior to reconstruction (exposure) of an image of the mask pattern from the first hologram, the second hologram is reconstructed to measure information of the relative displacement between the hologram recording medium and the wafer, and then, after the relative positions of the exposure region on the surface of the wafer and the first hologram of the hologram recording medium are finely superposed with each other, an exposure operation of the mask pattern by a reconstruction operation of the first hologram is performed.

In particular, in the measurement of the relative displacement information, when a reconstruction wave is irradiated upon the second hologram from the reconstruction wave irradiation optical system, the reconstruction wave is diffracted by the second hologram and irradiated as reconstruction light on the surface of the wafer. Here, the reconstruction light from the second hologram is convergent light which forms an image of the first alignment mark at the position at which the first alignment mark has been existed upon recording. Accordingly, if the surface of the wafer coincides with the image forming position of the reconstruction light, then an image of the first alignment mark is formed at the converging position of the reconstruction light on the surface of the wafer.

Thus, the reconstruction image detection means detects the reconstruction condition of the image of the first alignment mark on the surface of the wafer produced with the reconstruction light. The reconstruction image detection means may have any configuration only if it can detect the condition of the hologram reconstruction image formed on the surface of the wafer, such as, for example, means which measures the intensity or a wave front of light of the image, means which includes an observation optical system by way of which a real image of the hologram reconstruction image is observed, and so forth.

Information of the relative displacement between the wafer and the hologram recording medium is measured from a result of the detection of the reconstruction image detection means by relative position measurement means, and finally, the relative positional relationship between the wafer and the hologram recording medium is corrected in accordance with a result of the measurement, thereby completing the alignment operation. Thereafter, a mask pattern reconstructed from the first hologram is exposed to the surface of the wafer.

According to another aspect of the present invention, transmission diffraction light is produced from a first alignment mark of a mask illuminated with a coherent beam from an object wave irradiation optical system, and the transmission diffraction light is irradiated as an object wave for formation of a second hologram upon a hologram recording medium. Meanwhile, a reference wave irradiation optical system introduces a coherent beam as a reference wave for formation of the second hologram into the hologram recording medium. In this instance, the reference wave is introduced into the hologram recording medium from the opposite side to the position of the mask and is reflected by total internal reflection in the inside surface of the hologram recording medium adjacent the mask. Consequently, mutual interference between the reference wave and the object wave occurs in the hologram recording medium. A second hologram is formed in the hologram recording medium as a result of the interference action between the object wave and the reference wave.

Where the first alignment mark of the mask is constituted from, for example, a pin-hole, when the first alignment mark is irradiated with the object wave from the object wave irradiation optical system, transmission diffraction light produced from the first alignment mark is irradiated as radial divergent light onto the hologram recording medium. At the location of the hologram recording medium at which irradiation of the object wave receives, the reference light of a coherent beam is irradiated from the rear face side of the hologram recording medium by the reference wave irradiation optical system. Consequently, a concentrical holographic zone plate is formed in the hologram recording medium by an interference action between the object wave and the reference wave.

On the other hand, where the first alignment mark formed on the mask is, for example, in the form of a zone plate, a second hologram is formed at the position at which diffraction light diffracted from the first alignment mark irradiates the hologram recording means. For example, where a linear zone plate whose focal length is equal to the distance of the gap between the mask and the hologram recording medium is formed as the alignment mark, a second hologram in the form of a linear hologram is recorded on the recording medium with an object wave which converges on the hologram recording medium.

Subsequently, when a reconstruction wave is irradiated upon the second hologram from a reconstruction wave irradiation optical system, reconstruction light of an image of the first alignment mark is obtained from the second hologram. An image of the first alignment mark is formed on the surface of the wafer with the reconstruction light, and the reconstruction condition of the image is detected by reconstruction image detection means. Relative position measurement means measures information of the relative displacement between the hologram recording medium and the wafer in accordance with a result of the detection of the reconstruction image detection means, and the relative positional relationship between the wafer and the hologram recording medium is corrected in accordance with the relative displacement information, thereby completing the alignment operation.

According to a further aspect of the present invention, the reconstruction image detection means detects reflection light or transmission light from the surface of the wafer illuminated with the reconstruction light to detect the reconstruction condition of the image of the first alignment mark. Also in this instance, the detection of the reconstruction condition of the image of the first alignment mark may be performed by detection means of various types such as, for example, a type which measures the intensity or a wave front of light, or another type which detects a real image by way of an observation optical system.

Where the material of the substrate of the wafer is transparent such as of a glass substrate or where a through-hole such as a pin-hole or a slit is provided at the position of the wafer at which an image of the first alignment mark is to be formed, the image formation condition of the reconstruction image can be detected by detection of transmission light from the wafer irradiated with the reconstruction light. Naturally, it is also possible to detect reflection light by means of a reflection element provided at the image forming position of the surface of the wafer.

The reconstruction image detection means may alternatively constructed such that reflection light from the surface of the wafer irradiated with the reconstruction light is introduced to the second hologram again. In this instance, the reconstruction condition of the image of the first alignment mark on the surface of the wafer can be detected by detecting diffraction light from the second hologram irradiated with the reflection light.

In particular, the first alignment mark in this instance preferably has such a mark pattern as forms a holographic zone plate as the second hologram when it is recorded by holographic recording on the hologram recording medium.

For example, where the first alignment mark is constituted from a pin-hole, the second hologram is a concentrical holographic zone plate as described hereinabove. When the gap between the wafer and the hologram recording medium which has the second hologram constituted from such holographic zone plate is to be measured, diffraction light is produced from the holographic zone plate illuminated with a beam from the reconstruction wave irradiation optical system. The diffraction light converges at the position at which the mask has been upon recording to form an image of the first alignment mark, and accordingly, it is utilized as the reconstruction light to be detected by the reconstruction image detection means.

In particular, similarly as in ordinary reconstruction of a hologram, diffraction light which is produced form the holographic zone plate when a reconstruction wave conjugate with the reference wave is irradiated upon the holographic zone plate by the reconstruction wave irradiation optical system reconstructs an image of the first alignment mark (pin-hole) at an image forming position peculiar to it. Since a beam (reconstruction light) which converges at the peculiar image forming position is obtained from the holographic zone plate in this manner, the reconstruction image detection means detects that the reconstruction is in a focused condition when the surface of the wafer coincides with the image forming position.

Meanwhile, if the reconstruction light from the holographic zone plate enters the surface of the wafer in the focused condition as described above, reflection light from the surface of the wafer follows the path of the incidence light but in the opposite direction so that it enters the holographic zone plate again. As a result, diffraction light emerging reversely from the holographic zone plate makes a parallel beam, and the parallel beam advances along the former path of the reconstruction light reversely to return to the light source side.

If the surface of the wafer is out of a focused condition, diffraction light emerging reversely from the holographic zone plate from the reflection light from the surface of the wafer does not make a parallel beam but makes a convergent or divergent beam.

Accordingly, if a wave front of the diffraction light from the holographic zone plate originating from the reflection light is detected by reflection wave detection means, then at least it can be detected whether or not the diffraction light is parallel light, and it can be measured whether or not the surface of the wafer is displaced from the focused position. Further, the relative position measurement means measures information of the displacement of the surface of the wafer from the focused condition in accordance with a result of the detection by the reflection wave detection means. The displacement information is utilized for correction of the gap between the hologram recording medium and the wafer, and after an accurately focused condition of the surface of the wafer is achieved, the mask pattern is reproduced onto the exposure region at an appropriate position on the surface of the wafer by a holographic reconstruction operation of the first hologram.

It is to be noted that it is preferable to measure the value of the gap between the mask and the hologram recording medium in advance at the hologram recording step and perform rough alignment of the wafer in accordance with the measurement value upon starting of an alignment operation prior to a hologram reconstruction operation. In this instance, if, for example, the hologram recording medium is in a somewhat deformed condition, only such rough alignment will result in displacement of the focused position from the measurement value, but by performing a fine alignment operation in accordance with the present invention subsequently to the rough alignment, an accurately focused condition finely adjusted to the measurement value is achieved.

It is also to be noted that, in this instance, relative displacement information such as displacement in the X–Y directions, a rotational error and an inclination can be measured if a reflection portion or the like of a limited shape is provided at the position of the surface of the wafer at which an image of the first alignment mark is to be formed as described hereinabove.

According to a still further aspect of the present invention, the exposure apparatus described above further comprises correction means for correcting the relative positional relationship between the hologram recording medium and the wafer in accordance with a result of the measurement by the relative position measurement means. The wafer and the hologram recording medium are moved relative to each other in accordance with the relative displacement information between the wafer and the hologram recording medium by the correction means so that the exposure region of the wafer and the reconstruction image of the first hologram are superposed accurately with each other on the surface of the wafer. After the alignment operation is completed in this manner, a reconstruction image of the first hologram of the mask pattern, that is, a mask pattern image, is exposed accurately to the exposure region at the appropriate position of the wafer.

The correction means for performing the last correction operation in the alignment operation is at least required to precisely adjust the holding position for the wafer with respect to the hologram recording medium in accordance with the relative displacement information, for example, in terms of displacement in the Z-axis direction (gap value) or in the X–Y directions, a rotational angle around the Z-axis and an inclination with respect to the X–Y plane, and preferably allows adjustment at a plurality of positions at peripheral portions of the wafer. It is to be noted that the correction means may be constructed otherwise so as to correct both of the holding positions for the hologram recording medium and the wafer.

According to a yet further aspect of the present invention, in an alignment operation, reconstruction light of the first alignment mark is extracted from the second hologram illuminated with a reconstruction wave from the reconstruction wave irradiation optical system, and the reconstruction wave is utilized as inspection light for measurement of the relative positional relationship between the wafer and the hologram recording medium. The reconstruction wave is introduced to the wafer, and transmission light or reflection light from the wafer is detected by image formation detection means in terms of a superposed condition with the wafer mark (second alignment mark) on the wafer. The relative positional relationship between the wafer and the hologram is detected from a result of the detection by relative position detection means.

It is a matter of course that, also in this instance, the positional relationship between the first alignment mark and the mask pattern is matched in advance with the positional relationship between the second alignment mark (wafer mark) and a mask pattern reproduction region (exposure region) on the wafer, and by optically detecting the irradiation condition of the reconstruction light upon the wafer mark, or in other words, the superposition condition of the reconstruction image of the first alignment mark on the wafer mark, the relative positional relationship between the first hologram of the hologram recording medium and the exposure region of the wafer can be measured.

Where, for example, a first alignment mark constituted from a pin-hole described above is employed, a holographic zone plate is formed as a second hologram, and if a reconstruction wave is irradiated onto the second hologram, then a reconstruction wave which converges at a predetermined image forming position to form an image is obtained from the second hologram. Accordingly, when the surface of the wafer is irradiated with the reconstruction light, if the reconstruction light is focused (forms an image) as an accurate pin spot on the wafer mark, then it is detected that the relative positional relationship is established with accurate superposition. The converging condition and position of the pin spot are detected by the image formation detection means, and information of the relative displacement such as displacement of the gap or in the x–y direction is obtained from a result of the detection.

The image formation condition of the reconstruction light is detected by means of the image formation detection means from reflection light or transmission light from the wafer mark, and one of reflection light and transmission light as detection object light is selected in accordance with the material, the surface condition and so forth of the substrate itself of the wafer. Meanwhile, where a mark which produces diffraction light such as, for example, a mark in the form of a zone plate, is used as the first alignment mark or the wafer mark, transmission diffraction light or reflection diffraction light may be detected by means of the image formation detection means.

For example, where the wafer mark is constructed so that it produces diffraction light when the reconstruction light is irradiated thereon, the image formation detection means detects light obtained by reflection diffraction or transmission diffraction from the wafer mark.

In this instance, if it is assumed that the wafer mark has the construction of, for example, a diffraction grating and that diffraction light produced from the wafer mark which has a high diffraction intensity such as primary diffraction light is detected by the image formation detection means, then the influence of noise light or light other than the detection light is suppressed considerably. Since a variation of the diffraction angle or a variation of the intensity is produced if some relative displacement is produced between the wafer and the hologram recording medium, relative displacement information can be measured by detecting such variations.

The wafer mark can be constructed from a mark of the shape of a diffraction grating or a zone plate. Where a wafer mark in the form of a diffraction grating is used, that diffraction light produced from the wafer mark which has a high diffraction intensity such as primary diffraction light is detected by the image formation detection means. On the other hand, where a wafer mark in the form of a zone plate is used, preferably a mark in the form of a similar zone plate is used for the first alignment mark.

Where the wafer mark is constructed in the form of a zone plate, parallel light is produced by diffraction from the wafer mark irradiated with the reconstruction light from the second hologram. This corresponds to a case reverse to the case wherein diffraction light is produced from a zone plate irradiated with parallel light. Accordingly, by measuring the degree of parallelism, the position of an optical axis or the like of parallel light produced form the wafer mark irradiated with the reconstruction light from the second hologram, information of the relative displacement between the wafer and the hologram recording medium is measured.

The relative positional relationship between the hologram recording medium and the wafer is corrected in accordance with a result of the measurement of the relative position measurement means by the correction means, thereby completing the alignment operation. Thereafter, the first hologram of the mask pattern is reconstructed so that an image of the mask pattern is formed in an accurately superposed condition in the exposure region of the wafer.

According to a yet further aspect of the present invention, diffraction light from the wafer mark illuminated with illumination light of a wavelength equal to that of the object wave used upon recording of the second hologram is used as the inspection beam for measurement of the relative positional relationship between the wafer and the hologram recording medium in an alignment operation. In particular, in the alignment operation, wafer mark illumination light of a wavelength equal to that of the object wave used upon recording of the second hologram is introduced to the wafer mark by a wafer mark illumination optical system, and diffraction light (a diffraction wave) from the wafer mark illuminated with the wafer mark illumination light is introduced to the hologram recording medium on which the second hologram is formed.

In this instance, as the wafer mark, a wafer mark is used which has such a mark pattern as produces diffraction light equivalent to the object wave produced from the first alignment mark upon recording of the second hologram when the wafer mark is illuminated with the illumination light described above. When the relative positional relationship between the wafer and the hologram recording medium coincides accurately with the relative positional relationship between the mask and the hologram recording medium upon recording, the diffraction wave from the wafer mark enters the second hologram following the same optical path as that of the object wave used upon recording. In other words, the diffraction light from the wafer mark is utilized as virtual image reconstruction light (actually a beam which advances the optical path in the opposite direction to that of the reconstruction light produced from the second hologram) produced from the image of the first alignment mark.

Transmission diffraction light or simple transmission light from the second hologram illuminated with the diffraction wave from the wafer mark is detected by transmission light detection means, and the positional relationship between the wafer and the hologram recording medium is measured in accordance with a result of the detection by relative position measurement means. When it is tried to detect, for example, transmission diffraction light from the second hologram, if the virtual image reconstruction light is positioned accurately with the second hologram, then detection light which advances reversely along the same optical path as that of the reference wave used upon recording of the hologram, but if the virtual image reconstruction light is displaced from the second hologram, the detection light does not advance along the optical path. The transmission light detection means catches the detection light on the optical path along which the reference light has advanced upon recording, and measures a relatively displaced condition from the condition of the detection light.

In this instance, if the first alignment mark has the shape of a zone plate, then also the wafer mark has the shape of such a zone plate as it produces, when it is illuminated with the illumination light described above, a diffraction wave equivalent to the object wave produced from the first alignment mark upon recording of the second hologram. Where the first alignment mark or the wafer mark is formed in a zone plate pattern in this manner, when the transmission light detection means detects simple transmission light, the displacement condition between the wafer and the hologram recording medium can be detected readily only by detecting the converging position of the diffraction wave by an action of the zone plate.

On the other hand, where the marks are formed such that the gap between the wafer and the hologram recording medium coincides with the focal distance of the zone plate and the diffraction light from the second hologram illuminated with the diffraction wave from the wafer mark is detected, since the diffraction wave from the wafer mark converges on the second hologram to form an image of the wafer mark, the signal to noise ratio of the detection signal of the transmission light detection means is improved.

In this instance, the alignment system may further include reference reflection light detection means, and a result of detection by the reference reflection light detection means is utilized as a reference for detection of the relative displacement information described above. In particular, when reference inspection light equivalent to the reference wave used upon recording of the second hologram is introduced as inspection light to the second hologram, a reflection beam which follows the same optical path as that of the transmission light of the object wave used upon recording, or in other words, such a reflection beam (beam conjugate with the reconstruction wave) as follows the optical path of the reconstruction wave to be irradiated onto the second hologram upon ordinary reconstruction of the hologram, is obtained from the second hologram due to a characteristic peculiar to holography, and the reference beam is detected as reference light by the reference reflection light detection means. Then, when the detection light detected by the transmission light detection means coincides with the reflection beam detected by the reference reflection light detection means, it can be detected that the wafer mark is in the same positional relationship of the first alignment mark as upon recording to the second hologram.

By comparing and detecting the real image detection light or the transmission detection light described above with reference to the reference inspection light in this manner, detection of the relative positional relationship between the wafer and the hologram recording medium is performed. It is to be noted that, while, in this instance, the relative position measurement means measures the relative position between the reference light detected by the reference reflection light detection means and the detection light detected by the transmission light detection means, the measurement method for such measurement may be any of various methods including a method wherein the converging points of the reference light and the detection light are detected in accordance with individual detection methods for the reference light and the detection light and another method wherein wave fronts of the reference light and the detection light are detected.

In accordance with results of the measurement of the relative positional relationship obtained in such a manner as described above, correction of the relative position between the wafer and the hologram recording medium, which is the last stage of the alignment operation, is performed by the correction means. The correction means is only required to adjust the holding position of the wafer or the hologram recording medium, and since the hologram recording medium is in most cases fixed at a fixed position while the wafer is supported for replacement with the mask, preferably a mechanism for adjusting the holding position is provided mainly on the supporting means for the wafer.

The above and other objects, features and advantages of the present invention will become apparent from the following description and the appended claims, taken in conjunction with the accompanying drawings which are intended not restrictive but illustrative only.

BRIEF DESCRIPTION OF THE DRAWINGS

FIG. 1 shows an example of a production system for a holographic zone plate which generates a convergent beam for gap detection to be used for a hologram exposure method according to an embodiment of the present invention;

FIG. 2 shows an example of an optical system for detecting a gap using a holographic zone plate produced by the system shown in FIG. 1;

FIG. 3 shows an example of essential part of a detection optical system for detecting a wave front of signal light by measurement of a spot width with the system shown in FIG. 2;

FIG. 4 shows another example of an optical system for gap detection where a wave front of signal light is detected by measurement of a critical angle;

FIGS. 9A and 9B show patterns according to first and second embodiments of a first alignment mark, respectively;

FIGS. 10A and 10B illustrate two different examples of a superposing manner between a reconstruction image of the first alignment mark and a wafer mark on the surface of a wafer;

FIG. 11 shows an example of an optical system for observing a reconstruction image of the first alignment mark on the surface of a wafer:

DESCRIPTION OF THE PREFERRED EMBODIMENTS

Figure 5:
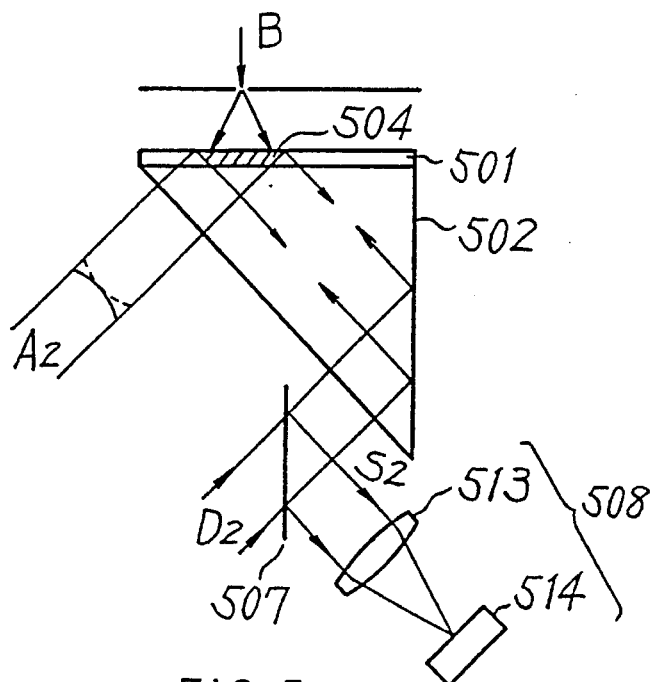
FIG. 5 shows a further example of an optical system for gap detection where a wave front of signal light is detected by measurement of an astigmatism.

First, in hologram exposure system according to an embodiment of the present invention, a mark in the form of a pin-hole is used as a first alignment mark, and a holographic zone plate formed from the mark is used for detection of a relative position for alignment operation. In order to simplify the description, detection of a relative gap between a wafer and a hologram recording medium will be described below by way of an example.

Formation of a second hologram for alignment will be described with reference to FIG. 1. In the present embodiment, a so-called total internal reflection holographic technique is applied, and a basic arrangement of a system for producing a second hologram applying the total internal reflection holographic technique is such as shown in FIG. 1. Referring to FIG. 1, a hologram recording medium 1 is disposed in such a form that it is held on an upper face of a prism 2, and an original mask 3 is supported by means of a support member not shown with a parallel gap of approximately 100 μm held from the hologram recording medium 1.

The hologram recording medium 1 is made of a photopolymer which does not require development processing, and a desired circuit pattern (not shown) and a pin-hole 20 serving as a first alignment mark for detection of a gap are formed by electron beam lithography on the original mask 3. The relative positional relationship between the mask pattern and the alignment mark is determined in advance.

In order to form a hologram (holographic zone plate) of the first alignment mark, the pin-hole 20 is illuminated with illumination light B from the upper face side of the mask 3, and the hologram recording medium 1 is irradiated with an object beam in the form of a spherical divergent wave C diffracted by and coming out of the pin-hole 20. Further, a reference wave A which is a coherent beam relative to the object illumination light B is irradiated onto the hologram recording medium 1 from the back or reverse face side. The reference wave A is reflected by total internal reflection from an inner side interface of the surface of the hologram recording medium 1 adjacent the mask 3. The object wave C and the reference wave A interfere with each other in this manner in the hologram recording medium 1.

In the present embodiment, an exit beam from an Ar laser source not shown is divided by amplitude division at a suitable ratio and introduced into different beam expanders to obtain a reference wave A and illumination light B of parallel light beams, which are subsequently introduced to respective irradiation positions as shown in FIG. 1.

When the pin-hole 20 which is an alignment mark on the mask 3 is illuminated with the illumination light B, a divergent spherical wave C by transmission diffraction light is produced from the back face side of the mask 3, and the wave C is introduced as an object wave into the hologram recording medium 1. Simultaneously, the reference wave A is introduced to a long oblique face side of the prism 2 so that it enters the hologram recording medium 1 through the inside of the prism 2. In particular, the reference wave A is introduced by the prism 2 into the irradiation area of the above-described divergent spherical face C in the hologram recording medium 1 and then reflected by total internal reflection from the inner side interface of the surface of the hologram recording medium 1 adjacent the mask 3. Consequently, the two light beams A and C interfere with each other in the hologram recording medium 1, and a holographic zone plate 4 as a hologram (second hologram) of the alignment mark is recorded in the hologram recording medium 1 by the interference.

It is to be noted that the circuit pattern (mask pattern) formed on the mask 3 is recorded as a first hologram onto the hologram recording medium 1 in the same arrangement conditions as those used upon recording of the holographic zone plate 4 using a reference optical system and an object optical system for mask pattern recording which are prepared separately from each other. Recording of the first hologram may be performed prior to or later than recording of the second hologram, or else, the first and second holograms may be recorded simultaneously.

After the first and second holograms are recorded on the hologram recording medium 1 in this manner, the mask 3 is removed first, and then a wafer 5 is mounted at the same position at which the mask has been placed as shown in FIG. 2. Then, the second hologram is reconstructed to effect an alignment operation including detection of the gap between the wafer 5 and the hologram recording medium 1, whereafter the first hologram is reconstructed so that the mask pattern is exposed on a resist of the wafer 5.

First in the alignment operation, the holographic zone plate 4 is used as an image forming element in order to reconstruct an alignment mark image from the second hologram, and detection light D in the form of parallel light beam which is conjugate with the reference light is introduced as a reconstruction wave for formation of a hologram image in the opposite direction. This is because, if the detection light D conjugate with the reference light A is introduced into a portion of the hologram recording medium 1 in the proximity of the holographic zone plate 4 as shown in FIG. 1, then a beam which converges at the position of the pin-hole 20 of the mask is obtained from the holographic zone plate 4.

It is to be noted that the wavelengths of the reference wave and the object wave for recording a mask pattern as a first hologram are equal to the wavelength of a reconstruction wave to be used upon reconstruction of the first hologram, and the wavelength is a photosensitive wavelength of the resist applied to the wafer 5. In contrast, the wavelength of light for recording a first alignment mark (pin-hole 20) for alignment operation as a second hologram (holographic zone plate 4) is on one hand equal to the wavelength of light used upon reconstruction of the second hologram, but, on the other hand, preferably is within a wavelength region within which the resist is not sensitized. If the two kinds of holograms recorded in this manner are recorded and reconstructed with light of different wavelengths respectively peculiar to them, then unnecessary exposure to the resist will occur during detection of a gap, and in another aspect, only if recording and reconstruction of the individual holograms are performed with light of the same peculiar wavelengths, no trouble occurs with an alignment operation.

Referring now to FIG. 2, a wafer 5 having a resist applied to the surface thereof is disposed at the position at which the mask 3 has been placed upon hologram recording. The wafer 5 is supported by a holding apparatus 6 the position of which is controlled so that the gap from the hologram recording medium 1 may be variably adjusted.

While the gap is adjusted, in the present embodiment, by varying the supporting position for a wafer with the hologram recording medium 1 held in a fixed condition, the method of the adjustment is not limited to any specific method and may be any method only if it allows adjustment of the relative positional relationship between the wafer and the hologram. Further, preferably the holding apparatus 6 is constructed such that the position of the wafer 5 can be adjusted finely relative to the hologram recording medium 1 in a plane (X–Y direction) parallel to the hologram recording medium 1 in addition to the adjustment of the gap, and also an adjustment system for adjusting the relative rotational error, the inclination or the like of the wafer 5 with respect to the hologram recording medium 1 is included in the present holding apparatus 6.

Upon detection of a gap, the detection light D is irradiated onto the holographic zone plate 4 as described hereinabove. Referring to FIG. 2, the detection light D supplied from the light source passes through a beam splitter 7 and then enters the prism 2. Then, the detection light D is reflected by total internal reflection once by a vertical minor side of the prism 2 and then enters the hologram recording medium 1 from a horizontal minor side of the prism 2 so that it is irradiated upon the holographic zone plate 4 present on the horizontal minor side of the prism 2. From the holographic zone plate 4 irradiated with the detection light D, diffraction convergent light E goes out toward the wafer 5. The convergent light E forms a reconstruction image (image of the pin-hole 20) at the position at which the pin-hole 20 has been placed upon recording.

In other words, the detection light D is converted into the convergent light E, which has an image forming position in the plane in which the mask has been placed, by a diffraction action by the holographic zone plate 4, and the wafer 5 is irradiated with the convergent light E. The convergent light E forms an image of the first alignment mark on the wafer 5, and reflection light is produced from the wafer 5 irradiated with the convergent light E and enters the holographic zone plate 4 again. From the holographic zone plate 4 irradiated with the reflection light, diffraction signal light S is produced, and the signal light propagates in the opposite direction along the optical path of the detection light D.

The signal light S is reflected by total internal reflection by the vertical minor side of the prism 2 and emerges from the major oblique side of the prism 2 so that it is introduced to and reflected by the beam splitter 7 and then enters a detection optical system 8.

The signal light S is a plane wave conjugate with the detection light D where the wafer 5 is disposed accurately at the position at which the mask has been placed, that is, where the wafer 5 is located at the image forming position of the convergent light E. In other words, where the condition wherein an image of the first alignment mark is reconstructed accurately is established, the signal light S is a plane wave.

In contrast, where the wafer 5 is arranged with a gap greater than the appropriate gap, the signal light S is convergent light. On the contrary, where the wafer 5 is disposed with a gap smaller than the appropriate gap, the signal light S is divergent light.

Accordingly, by measuring a wave front of the signal light S by means of the detection optical system 8, information of a displacement condition of the surface of the wafer 5 from the image forming position of a reconstruction image of the second hologram, that is, an error of the gap, can be detected, and the position of the wafer can be corrected in accordance with the relative displacement information so that an optimum gap may be obtained by the holding apparatus 6.

In this manner, in the present embodiment, a reconstruction condition of the alignment mark image from the holographic zone plate 4 on the surface of the wafer is detected directly as a gap, that is, as displacement information between the image forming position of the reconstruction image of the second hologram recorded on the hologram recording medium 1 and the mask position from the image forming position of the hologram image. Consequently, even if the position at which the hologram reconstruction image is formed is varied from the mask position due to, for example, deformation of the hologram recording medium, detection of the image forming position and adjustment of the gap can be performed accurately in accordance with the condition after such variation.

In particular, the convergent light E mentioned hereinabove is a beam which forms a reconstruction image of the first alignment mark from the second hologram, and since the first alignment mark in the present embodiment is the pin-hole 20, the condition wherein an image of the pin-hole is reconstructed accurately on the surface of the wafer 5 is an optimum reconstruction condition of the hologram. Accordingly, by detecting whether or not the convergent light E converges appropriately on the surface of the wafer 5, an error of the gap, that is, a relative displacement error between the wafer and the hologram recording medium can be detected.

Several methods are available for measuring the gap by detecting a wave front of the signal light S. The basic concept of the detection optical system 8 illustrated in FIG. 2 detects how much the signal light S is displaced from a parallel light beam. As a detection method of the type mentioned, various methods are known including a spot width measurement method, another method wherein an astigmatism is measured, an oblique incidence method [X-rays lithography], a knife-edge method, a Foucault's method and a method wherein a critical angle is measured ("Recent Roughness Measurement by Optical Contact", O plus E, April, 1985, p.71). In the present embodiment, any of the methods mentioned may be employed only if the inclination or curvature of a wave front of the signal light S can be detected by the method.

First, an embodiment wherein the method of measuring a spot width is applied will be described. The detection optical system in the present embodiment includes, as shown in FIG. 3, a convex lens 309, and a photodiode array 310 disposed at the focus position of the convex lens 309. In the present embodiment, the diameter of a spot of the signal light S converged on the photodiode array 310 by the convex lens 309 presents its minimum value when the wave front of the signal light S is a flat plane, and in any other case, the spot diameter has a larger value.

In particular, the wave front of the signal light S makes a flat plane when the signal light S is parallel light, and in this instance, the signal light S is converged (makes a spot light) at the focus position by the convex lens 309. However, when the signal light S is convergent light or divergent light, the converged position is displaced from the original focus position. Consequently, by measuring a detection signal from each element of the photodiode array 310 in connection with the original focus position, a converging condition of the signal light S can be measured and it can be measured by what amount the wave front of the signal light S is displaced from a flat plane condition.

In the present embodiment, the condition wherein the wave front of the signal light S makes a flat plane is presented when the surface of the resist and the image forming position of the reconstruction image of the holographic zone plate 4 coincide with each other, and accordingly, alignment of the gap can be achieved by finely adjusting the wafer holding position by the holding apparatus 6 so that the spot diameter detected by the photodiode array 310 may be in the minimum.

Any of the other detection methods mentioned above can be applied similarly by replacing the detection optical system suitably. However, particularly the critical angle method and the astigmatism method among the methods can be realized with arrangements which make effective use of characteristics peculiar to a total reflection hologram. Embodiments wherein the critical angle method and the astigmatism method are applied will be described below.

FIG. 4 illustrates a concept of an embodiment wherein a detection method based on the critical angle method is applied. In the embodiment shown, in order to record a holographic zone plate 404 onto a holograph recording medium 401, a reference wave A1 is introduced in the following manner. First, the reference wave A1 enters a major oblique side of a prism 402 and then enters the holograph recording medium 401 disposed in contact with a horizontal minor side of the prism 402. The reference wave A1 is reflected by total internal reflection at an interface of the holograph recording medium 401 with the air and then enters an inner face of a vertical minor side of the prism 402 at a critical angle θc.

Meanwhile, upon gap detection, detection light D1 conjugate with the reference light A1 enters the inner face of the vertical minor side of the prism 402 at the critical angle θc from the major oblique side of the prism 402, and the beam reflected by total internal reflection by the inner face is introduced to the holographic zone plate 404.

In the present embodiment, the detection light D1 totally reflected by the inner face of the vertical minor side of the prism 402 is diffracted by the holographic zone plate 404, and the diffraction light produced from the holographic zone plate 404 is converged as reconstruction light of the alignment mark image at the image forming position. The reconstruction light is reflected by the wafer 405, and this refrected light is propagated as a signal light S1 along the same path but in the opposite direction. The signal light S1 thus comes out of the prism 402 and is then reflected by a half mirror 407, whereafter it enters a gap detection optical system 408.

The gap detection optical system 408 is constituted from a converging lens 411, a two-split detector 412 and some other elements, and the signal light S1 in the present embodiment is converged by the converging lens 411 and then received by the two-split detector 412. A pair of light receiving portions of the two-split detector 412 are positioned in alignment with a focus position of the converging lens 411 so that a synchronizing signal is generated when the signal light S2 is in an optimum image forming condition.

When the wafer 405 is not positioned at the optimum image forming position for a hologram reconstruction image, the signal light S1 becomes a divergent wave or a convergent wave as described hereinabove, and consequently, the incidence angle of the signal light S1 to the inner face of the vertical minor side of the prism 402 varies locally. Consequently, part of the signal light S1 exhibits an incidence angle exceeding the critical angle and is not reflected by total reflection there. For example, when the signal light S1 is a divergent wave, a beam of the signal light S1 from the horizontal minor side toward the vertical minor side of the prism 402 in FIG. 4 at an upper half with respect to an optical axis of the signal light S1 presents an incidence angle exceeding the critical angle when it enters the inner face of the vertical minor side of the prism 402. Consequently, at the portion, the signal light S1 is not reflected by total reflection by but partially passes through the vertical minor side of the prism 402, and accordingly, the intensity of the reflected light from the portion is decreased.

If the signal light S1 reflected by the inner face of the vertical minor side of the prism 402 enters the two-split detector 412 in this condition, then the signal light from the portion which has not totally reflected the signal light S1 is reduced in intensity comparing with the signal light from the other portion. The two-piece detector 412 generates a detection signal corresponding to a light amount distribution on the opposite sides of the optical axis of the signal light S1. If the light amount distribution is one-sided, then two detector elements of the two-split detector 412 produce asymmetrical signals having different detection intensities.

In this manner, when the wafer 405 is not positioned at the optimum image forming position of the second hologram, the signal S1 becomes a divergent wave or a convergent wave, and consequently, presence or absence of displacement (a gap error) of the wafer 405 can be detected depending upon whether or not detection signals of the two-split detector 412 are asymmetrical signals. If the supporting position of the wafer 405 is finely adjusted by the holding apparatus so that such deviation in light amount is eliminated and consequently balanced detection signals are obtained from the two-split detector 412, then this means that correction of the gap has been achieved.

Subsequently, another embodiment wherein a detection method based on the astigmatism method is applied will be described. In the astigmatism method, the detection optical system must necessarily generate convergent light having some astigmatism using a cylindrical lens or a like element. However, a similar effect can be obtained also by making wave fronts of recording light and reconstruction light for a holographic zone plate different from each other by an amount of astigmatism.

The embodiment shown in FIG. 5 is an example of detection means which applies the astigmatism method. Referring to FIG. 5, a holographic zone plate 504 is recorded by recording light A2 having some astigmatism. If a plane wave is introduced as detection light D2 into the holographic zone plate 504 formed in this manner, then signal light S2 reflected by and returning from the surface of the wafer has astigmatism. With the present arrangement, a detection optical system based on the astigmatism method can be constructed without using a cylindrical lens for a detection optical system 508.

It is to be noted that the detection optical system 508 includes a converging lens 513 and a four-split detector 514, and four light reception portions of the four-split detector 514 are positioned in alignment with a focus position of the converging lens 513.

If detection of the signal light S2 is performed with the arrangement construction described just above, then when the wafer is not at the optimum image forming position of the second hologram, asymmetric detection signals are produced from the four-split detector 514 in accordance with the astigmatism. Therefore, by adjusting the position of the wafer by means of the holding apparatus for a wafer in response to the detection signals so that symmetric signals may be obtained from the four-split detector 514, an image forming position can be detected and the gap can be corrected. Further, while the case wherein the recording light A2 of the holographic zone plate 504 has some astigmatism is described here, similar detection can be achieved also with another construction wherein a plane wave is used as recording light and detection light has some astigmatism.

Figure 6:
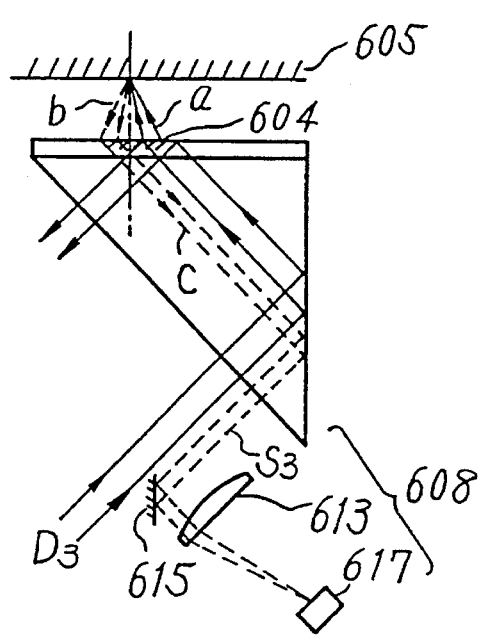
FIG. 6 shows a still further example of an optical system for gap detection where a wave front of signal light is detected applying an oblique incidence method.

Subsequently, an embodiment wherein the oblique incidence method is applied will be described with reference to FIG. 6. As shown in FIG. 6, parallel light D3 for detection in the oblique incidence method is introduced into a holographic zone plate 604 asymmetrically with respect to an optical axis of the holographic zone plate 604. The holographic zone plate 604 is produced using a pin-hole pattern of a mask similarly as in the embodiment described hereinabove.

When a wafer 605 is at an optimum image forming position for a reconstruction image of the second hologram, diffraction convergent light a directed toward the surface of the wafer 605 is produced from the holographic zone plate 604 irradiated with the detection light D3, and the convergent light a forms a pin-hole image on the surface of the wafer 605. Reflected light b from the pin-hole image on the surface of the wafer 605 is converted into parallel light c by the holographic zone plate 604 and then reflected by total internal reflection by a vertical minor side of a prism so that it thereafter goes out as signal light S3 from the prism. The signal light S3 is reflected by a mirror 615 and converged upon an optical axis of a lens 613 by the lens 613.

In the detection optical system 608 in the present embodiment, a two-split detector 617 is disposed at the converged position of the signal light S3 on the optical axis of the lens 613. When the wafer 605 is not positioned at the image forming position of the hologram, the signal light S3 enters the two-split detector 617 at a position displaced from a central dividing portion of the light receiving face of the two-split detector 617. Consequently, correction of the gap can be performed by controlling the position of the wafer 605 by means of a wafer holding apparatus while measuring a differential signal between the outputs of two detector elements of the two-split detector 617 to finely adjust the gap.

While the methods of measuring the gap between a point on a wafer and a hologram recording medium are described in the foregoing embodiments, it is also possible to record a holographic zone plate for detection of a gap at a plurality of positions (for example, three positions) and detect an inclination (tilt) between the wafer and the hologram recording medium at a time with the holographic zone plates to effect correction of the gap.

Figure 8:
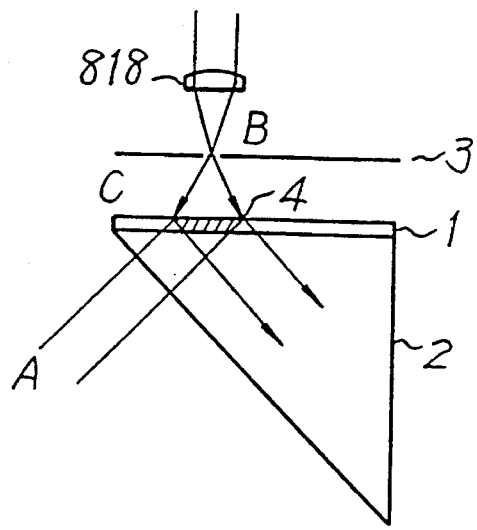
FIG. 8 shows another example of a production system for producing a holographic zone plate according to another embodiment of the present invention.

Further, while illumination light upon the first alignment mark to record the second hologram for alignment is described as parallel light obtained by expanding a light beam from a light source by means of a beam expander, it is also possible to illuminate an alignment mark with light condensed by means of an optimum lens 818 as shown in FIG. 8 to increase the illumination efficiency of illumination light.

Figure 7:
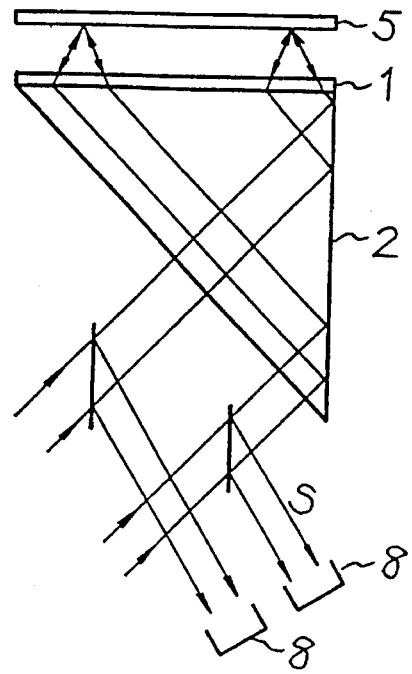
FIG. 7 shows a yet further example of an optical system for gap detection where a gap is detected at a plurality of positions.

It is to be noted that, in FIGS. 7 and 8, like elements to those of FIGS. 1 and 2 are denoted by like reference numerals, and description of them is omitted herein to avoid redundancy.

On the other hand, where the alignment mark employed is not such a pin-hole as in the embodiments described above but a slit, a holographic zone plate is formed in a belt-shaped region (linear holographic zone plate). Also in this instance, relative position detection such as gap detection can be performed in a similar manner as in the embodiments described above. Which one of a pin-hole and a slit should be selected may be determined suitably taking arrangement conditions of the mask pattern and the alignment mark with respect to the mask and so forth into consideration, and where a plurality alignment marks are provided, both of them may be used.

Subsequently, an embodiment which involves detection of and adjustment against relative displacement in the X–Y direction will be described. The embodiments described above effect detection and so forth of displacement of the gap by detecting reflection light from the surface of a wafer, and in order to apply this simply to effect detection of and adjustment against relative displacement in the X–Y direction, the following measures may be available.

A first measure involves provision of a reflecting portion only at an alignment image forming position on the surface of a wafer. With the first measure, relative displacement in the X–Y direction can be detected by detecting, by means of a detection system, whether or not reconstruction light of an alignment mark image is reflected from the surface of a wafer (or a detection intensity variation of such reconstruction light).

For example, where an alignment mark in the form of a pin-hole is used, a similar pin-hole may be provided on the surface of a wafer at a position corresponding to the alignment mark image forming position such that transmission light through the pin-hole of the wafer is detected by means of a detection system.

Further, as the first alignment mark, slit marks 1020 arranged to extend in the X–Y directions may be used as shown in FIG. 9A or a plurality of pin-hole marks 1021 arranged in lines in the X–Y directions may be used as shown in FIG. 9B. In those cases, a displacement condition in the X or Y direction can be detected by detecting a reconstruction condition of a hologram reconstruction image of the slit mark 1020 over the overall length or by detecting a reconstruction condition of each of hologram reconstruction images of the pin-hole marks 1021.

Where a mark and a second hologram to which any of such zone plates as described above is applied is used for an alignment detection system, the dynamic range of the detection system depends upon the magnitude of the zone plate. Consequently, if the zone plate is formed large, then even if the relative displacement is great, it can still be detected, and accordingly, it is also possible to use the zone plate for rough alignment.

For example, where a pre-alignment apparatus of a rough accuracy is not provided in addition to an alignment mark for X–Y alignment and a second hologram corresponding to the alignment mark, a rather large rough alignment mark may be provided in a region, which has a less influence upon a circuit pattern and so forth, separately from the alignment mark for fine alignment.

Further, when attention is paid to detection of the gap, the accuracy in detection of the gap must necessarily be suppressed within an error of a depth of focus upon exposure of the first hologram of a circuit pattern. In the embodiments described above, since an actual reconstruction condition of the second hologram is detected, if the reconstruction condition of the alignment system is appropriate, then it can be performed very readily to effect positioning within the depth of focus upon exposure of the first hologram of the circuit pattern.

Taking the accuracy of detection of the gap into consideration, the detection accuracy is improved by increasing the divergence (or convergence) angle of a diffraction beam produced from a pin-hole or a zone plate employed in any of the embodiments described above, or in other words, by increasing the numerical aperture N.A. To this end, it is necessary to reduce the diameter (increase the divergence angle) of the pin-hole or reduce the line thickness (increase angle) of the zone plate. However, since there is a limitation in perforation of a fine pin-hole or minimization of the zone plate, it is in most cases difficult to produce a pin-hole or a zone plate.

Thus, it is considered a practical countermeasure to use higher-order diffraction light of a zone plate. While higher-order diffraction light is low in intensity itself comparing with lower-order diffraction light, the intensity of light does not matter for detection itself with a method wherein a wave front condition is detected. It is to be noted that, while first-order light and third-order light (or fifth-order light or seventh-order light) cannot be distinguished from each other only with a wave front, if the gap is confined in advance to the proximity of the converged position of diffraction light as an object for detection by pre-alignment, then diffraction light only of a necessary order can be detected, and consequently, if the present method is adopted, more accurate gap alignment can be achieved.

While the embodiments wherein a holographic zone plate is applied are described so far, the present invention can be applied to other cases which employ some other mark. For example, depending upon the construction or system of a holographic exposure apparatus, a hologram reconstruction image for alignment can sometimes be observed directly. With a holographic exposure apparatus of such type, for example, by providing observation means for directly observing an alignment mark image forming position, an alignment mark image on a wafer can be detected directly, and also a reconstruction condition of the alignment mark image can be detected directly.

Further, it is also possible to provide a second alignment mark (wafer mark), which is easy to compare with a first alignment mark on the mask side, on the surface of a wafer and detect relative displacement information by superposition between a reconstruction image of a second hologram and the wafer mark as shown in FIGS. 10A and 10B. FIG. 10A illustrates the case wherein a partial projecting portion (or a reflecting portion or a transmitting portion may be applicable) is provided at an alignment mark image forming position on a wafer. When a reconstruction image is formed from a hologram originating from a first alignment mark 210 on a mask on a projecting portion 211 as a partial wafer mark, a superimposed detection image 212 of an image of the alignment mark 210 and another image originating from the projecting portion 211 is obtained from the observation optical system. Meanwhile, FIG. 10B illustrates the case wherein a wafer mark 214 which is easy to compare with the first alignment mark 210 on the mask side is provided at the image forming position on a wafer. In this instance, a detection image 215 is obtained from the observation optical system.

Accordingly, relative displacement information is measured from those detection images and the relative position between the wafer and the hologram recording medium is corrected, for example, by means of the wafer holding apparatus 6 by which the relative position in the X–Y directions can be adjusted.

The observation optical system is not particularly limited to the specific one only if it is constructed such that it can detect an alignment mark image or a reconstruction condition of such alignment mark image. As an example, in a holographic exposure apparatus wherein a so-called total internal reflection holographic technique is applied as in the embodiments described above, a reconstruction condition of an alignment mark image can be detected directly by providing an observation optical system for observing an alignment mark image forming position as shown in FIG. 11.

Referring to FIG. 11, when a reconstruction wave D12 is irradiated upon a hologram mark 204 formed on a hologram recording medium 201, an alignment mark reconstruction image is formed on a wafer 205. Here, where the wafer 205 is formed from an opaque substrate, an observation system 282 for observing an alignment mark image formed on the surface of the wafer 205 through a prism 202 is used. On the other hand, where the wafer 205 is formed from a transparent substrate such as a glass substrate, another observation optical system 280 provided above the wafer 205 is used.

Meanwhile, the observation systems may be replaced by an imaging optical system and an image sensor or a like element arranged at a position conjugate with an alignment mark image forming position of the imaging optical system, by means of which an alignment mark image reconstructed on a wafer is imaged and detected.

It is to be noted that the present invention can naturally be applied also to an exposure apparatus which employs a holographic technique based on any other method if a system which can detect an alignment mark image formed on a wafer is provided.

Figure 12:
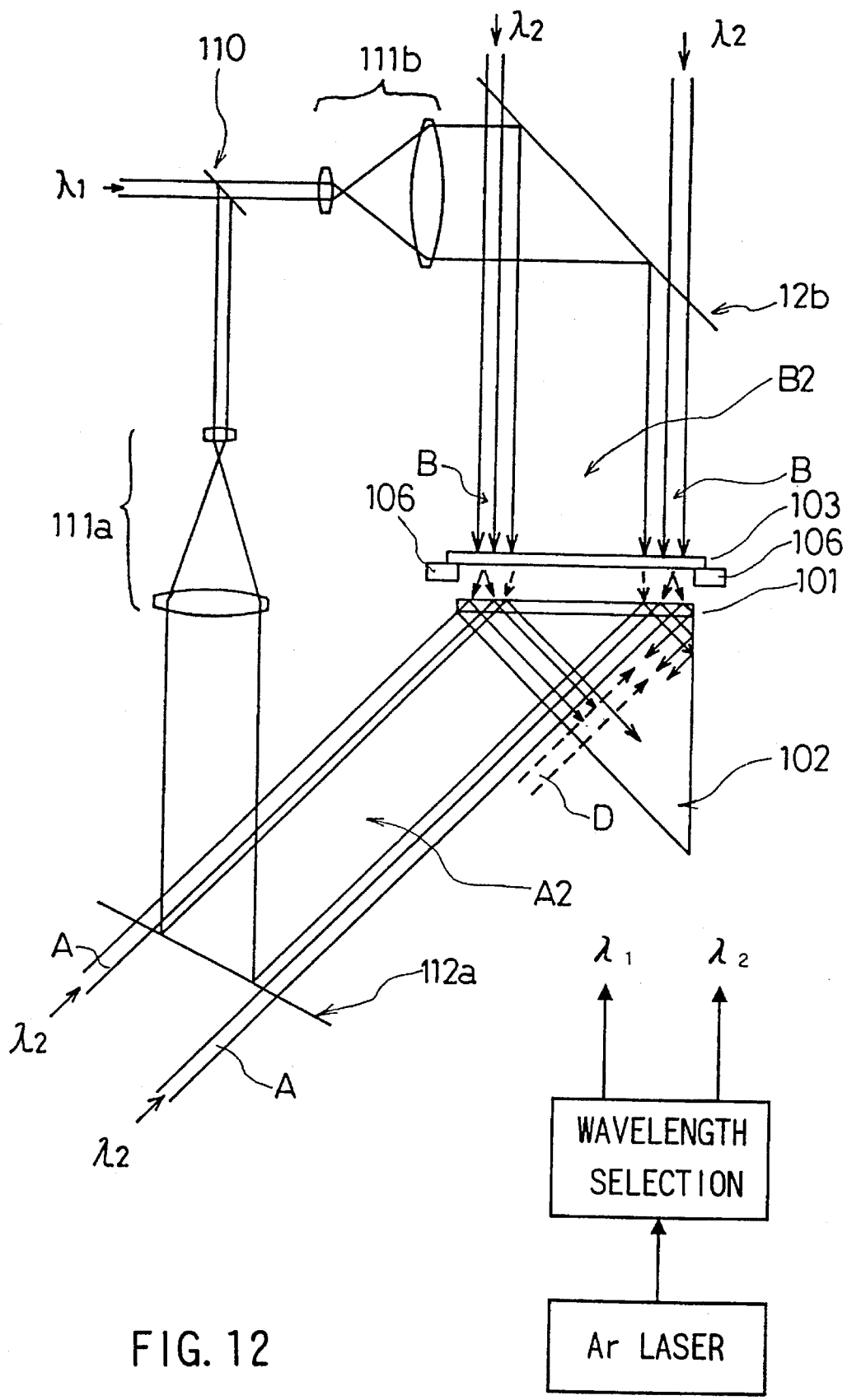
FIG. 12 shows schematic construction of an optical system of a holographic apparatus according to an embodiment of the present invention.

FIG. 12 shows general construction of an exposure apparatus which utilizes holography according to an embodiment of the present invention. In the holography exposure apparatus, a prism 102 having a cross section of an isosceles right triangular shape is used and arranged with one of two horizontal minor sides thereof directed upwardly and a hologram recording medium 101 is held on the horizontal minor side of the prism 102. A mask 103 is supported above the hologram recording medium 101 with a predetermined gap (approximately 100 μm) left therebetween by means of a holding apparatus 106. A hologram recording layer of the hologram recording medium 101 is made of a photo-polymeric material into which a hologram can be recorded by an photo-chemical reaction and which does not require, for example, development. The mask 103 has a desired circuit pattern (mask pattern) and a first alignment mark formed thereon as well known in the art by electronic beam drawing.

The holding apparatus 106, on the one hand, holds a mask when the hologram recording operation is performed, and, on the other hand, when the alignment operation or exposure operation is performed, it holds a substrate (wafer) having a photosensitive surface in place of such mask. The holding apparatus 106 is constructed so as to support a mask or a wafer at a plurality of points and allow adjustment of the position at each of the supporting points. By the positional adjustment, a mask or a wafer supported can be displaced in two perpendicular directions (X–Y directions) within the supporting plane and a vertical direction (Z direction: gap) including an inclination and a rotational error.

In the meantime, in the present embodiment, a coherent beam (wavelength λ1) for a circuit pattern and another coherent beam (wavelength λ2) for an alignment mark are used as source light beams. For the source light beams, an exit beam from an Ar laser may be divided by wavelength division to extract beams of two different wavelengths as well known in the art, or else, individual beams from separate light sources or light beams of an equal wavelength may be employed as the case may be.

In order to form a hologram of a first alignment mark, a light source system may be constructed so that reference light A and object illumination light B which are beams (wavelength λ2) coherent with each other are introduced from the reverse face side of the hologram recording medium 101 and the upper face side of the mask original plate 103. In the present embodiment, a beam (wavelength λ2) selected by wavelength selection from exit light from an Ar laser is divided by amplitude division at a suitable ratio into two beams, and the two beams are converted into and introduced as a reference wave A and object illumination light B of parallel beams by means of beam expanders as well known in the art.

When the first alignment mark on the mask 103 is illuminated with the object illumination light B, an object wave C by transmission diffraction light is produced from the reverse face side of the mask 103 and enters the hologram recording medium 101. Simultaneously, the reference wave A enters the hologram recording medium 101 from the prism 102 side and is introduced to the illuminating region of the object wave C and then totally reflected in the inside of the hologram recording medium 101. Consequently, the two waves interfere with each other in the hologram recording medium 101 so that a second hologram is recorded.

In order to reconstruct the second hologram recorded in this manner, parallel light conjugate with the reference wave A should enter as a reconstruction wave, and the reconstruction wave D is introduced in the opposite direction along the path along which the reference wave A goes out from the prism 102 as shown in FIG. 1 so that it enters a major oblique side of the prism 102. The reconstruction wave D is then reflected by total internal reflection by a vertical minor side of the prism 102 and enters the hologram recording medium 101 through the horizontal minor side of the prism 102. Then, from the second hologram illuminated with the reconstruction wave D, reconstruction light is obtained which converges at the position of the first alignment mark of the mask 103 to form an image.

A circuit pattern (not shown) formed on the mask 103 is recorded as a first hologram onto the hologram recording medium 101 using the reference optical system and the object optical system for pattern recording in the same condition as in the relative positional relationship between the mask and the hologram recording medium upon recording of the second hologram.

For the beam for circuit pattern recording, a beam (wavelength λ1) for a pattern obtained by wavelength selection of an emergent beam from the Ar laser is used. The beam of the wavelength λ1 is divided by amplitude division at a suitable ratio by a half beam 110 into two beams, and the two beams are converted into a reference wave A2 and object illumination light B2 of parallel beams by beam expanders 111a and 111b. The reference wave A2 and the object illumination light B2 are reflected by dichroic mirrors 112a and 112b, which pass light of the wavelength λ2 therethrough but reflect light of the wavelength λ1, respectively, and then introduced into the hologram recording medium 101 and the mask 103, respectively.

The object illumination light B2 irradiates the circuit pattern formation region of the mask 103, and the hologram recording medium 101 is irradiated with transmission diffraction light (object wave) through the circuit pattern. The reference wave A2 is irradiated upon the object wave irradiation region from the reverse face side of the hologram recording medium 101 and totally reflected in the inside of the hologram recording medium 101, and a first hologram corresponding to the circuit pattern is formed in the hologram recording medium 101 by mutual interference between the object wave and the reference wave.

Subsequently, the mask 103 is removed and a wafer is mounted at the same position to effect an exposure operation to the wafer. Prior to exposure to the wafer, an alignment operation by positioning of the gap and in the X–Y direction between the wafer and the hologram recording medium 101 is performed, and thereafter, a reconstruction image of the first hologram is formed on the resist of the wafer and the circuit pattern is exposed and reproduced onto the resist.

It is to be noted that the wavelength ($\lambda 1$) of light for recording a circuit pattern as a first hologram or reconstructing the first hologram is a photosensitive wavelength of the resist applied to the wafer while light ($\lambda 2$) of a wavelength region within which the resist is not sensitive to the light is preferably used as the wavelength of light to be used for recording and reconstruction of a second hologram for alignment as described hereinabove.

Figure 13:
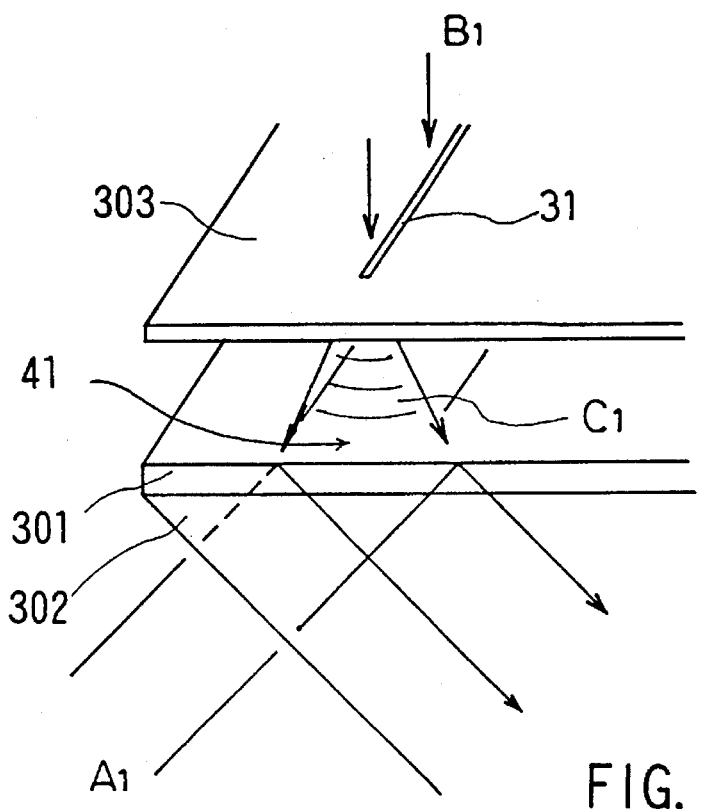
FIG. 13 illustrates a manner of essential part of the first embodiment when a second hologram is recorded with the system shown in FIG. 12.
Figure 14:
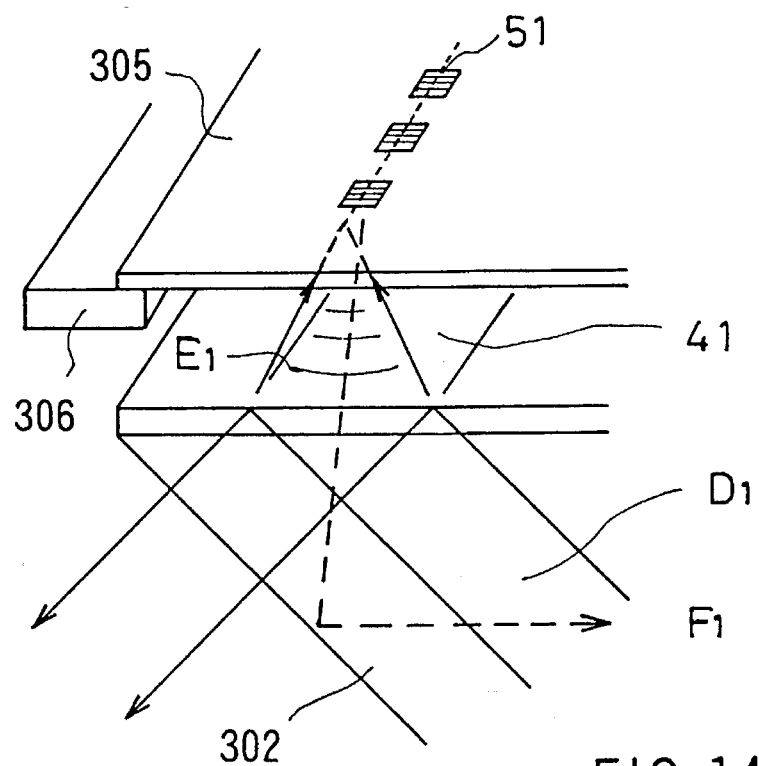
FIG. 14 illustrates a manner of essential part of the first embodiment when the second hologram is reconstructed with the system shown in FIG. 12.

FIGS. 13 and 14 illustrate a first embodiment of an alignment operation which is performed with the exposure apparatus shown in FIG. 12. In the present first embodiment, a first alignment mark 31 (hereinafter referred to as an alignment slit) in the form of a slit is provided on a mask 303.

When object illumination light B is irradiated upon the alignment slit 31, transmission diffraction light produced from the slit 31 is irradiated as a divergent cylindrical wave (object wave) C1 upon a hologram recording medium 301. From the rear face side of the hologram recording medium 301, a reference wave A is irradiated upon the irradiation area of the divergent cylindrical wave C1 and totally reflected in the inside of the hologram recording medium 301, and the two beams interfere with each other so that a linear holographic zone plate 41 is formed as a second hologram in the hologram recording medium 301.

Subsequently, while the relative positional relationship between the mask and the hologram recording medium is maintained, the first hologram of the circuit pattern is recorded onto the hologram recording medium 301. It is to be noted that, if necessary, fixation exposure of the holograms or the like is performed.

The mask 303 is removed, and instead, a wafer 305 is placed in an pre-aligned condition at the position at which the mask 303 has been arranged as seen in FIG. 14, and the wafer 305 is held for positional adjustment by a holding apparatus 306. It is to be noted that, although the pre-alignment is not always necessary, when enhancement in throughput is taken into consideration, preferably such pre-alignment should be performed with rough accuracy similarly as in the prior art.

The holding apparatus 306 has a position controllable construction such that it can adjust the position of a wafer 305 or the like received thereon precisely in horizontal directions (X–Y directions) and a vertical direction (Z direction). In the present embodiment, while the hologram recording medium 301 is fixed, the relative positional relationship is corrected by adjusting the supporting position of the wafer 303. However, naturally the present invention is not limited to the specific means.

Pattern reproduction has been performed one or more times for the wafer 305 so that a grating mark 51 composed of a diffraction grating for alignment is provided as a wafer mark on the wafer 305. The location of the grating mark 51 is selected so that it has a same positional relationship to the region in which the circuit pattern is formed on the wafer 305 as the positional relationship between the circuit pattern on the mask 303 and the alignment slit 31.

When a reconstruction wave D1 is irradiated upon the holographic zone plate 41, reconstruction light E1 diffracted here makes a beam which converges at the position at which the first alignment mark of the mask has formally been located, and consequently, the reconstruction light E1 forms a reconstruction image of the first alignment mark at the converging point.

Here, if the grating mark 51 is located at the converging position of the reconstruction light E1, then the reconstruction light E1 is reflected and diffracted by the grating mark 51 so that detection diffraction light F1 is obtained. In the present embodiment, since a diffraction grating of the reflection type is applied as the grating mark 51, the detection diffraction light F1 reflected and diffracted by the grating mark 51 passes through the holographic zone plate 41 and enters the prism 302 so that it is totally reflected in the inside of the prism 302. Thereafter, the detection diffraction light F1 goes out of the prism 302 and enters a detection system which will be hereinafter described.

The detection diffraction light F1 presents a maximum intensity when the wafer 305 is aligned accurately, and when the wafer 305 is displaced in the X–Y direction or when the gap is not in a correct condition (that is, displaced in the Z direction), the intensity decreases. In particular, the condition wherein the reconstruction light E1 is not irradiated accurately upon the grating mark 51 is the condition wherein displacement in the X–Y direction is present, and in this instance, the detection diffraction light F1 cannot be detected. On the other hand, when the gap is in a correct condition, since this is the condition wherein the reconstruction light E1 converges accurately on the grating mark 51, the intensity of the reflected diffraction light is high. However, if the gap is not accurate, then the reconstruction light E1 does not converge on the grating mark 51 but forms a blurred spot, and consequently, also the intensity of the reflected diffraction light is low.

Accordingly, alignment is performed by correcting the wafer holding position by the holding apparatus 306 so that the intensity of the detection diffraction light F1 exhibits its maximum. In this case, if only the detection diffraction light from the single grating mark 51 is detected, although the gap alignment at the position can be performed accurately from only the detection intensity, alignment in terms of the X–Y alignment, the inclination, the rotational error and so forth cannot be performed accurately. Therefore, in the present embodiment, each of the alignment marks in the form of a slit whose longitudinal direction coincides with the X or Y direction is used as shown in FIG. 9A and a plurality of diffraction gratings are arranged in a suitably spaced relationship as wafer marks (refer to FIG. 14).

Further, such alignment marks and wafer marks are disposed at a plurality of positions (at the corner portions in the present embodiment) of a mask and a wafer, respectively. Consequently, by obtaining detection diffraction light E1 from the individual grating mark 51, alignment in the X–Y direction (including a rotational error of the mask and so forth) or in a tilting direction or the like is performed at a time.

Exposure of a circuit pattern is performed such that, in a condition after the alignment described above is completed, a reconstruction wave is irradiated upon the first hologram of the circuit pattern using a reconstruction optical system for a circuit pattern, and with reconstruction light in the form of transmission diffraction light from the first hologram, a reconstruction image of the circuit pattern is formed in the circuit pattern formation region on the wafer 305. In this instance, alignment is performed with reference to another wafer mark formed simultaneously with or separately from another circuit pattern formed in the precedent exposure operation so that the following circuit pattern can be superimposed accurately and exposed.

In the present embodiment, the grating mark 51 for which a diffraction grating is applied is used as the wafer mark, and the direction of the grating line is set to a direction different from (perpendicular to) the direction of the slit of the first alignment mark. As a result, reflection diffraction light advances in a different direction from that of regular reflection light on the surface of the wafer and no other reflection light or the like is included in the detection diffraction light El, and consequently, an influence of detection noise is eliminated.

Further, while a diffraction grating of the reflection type is used as a wafer mark in the present embodiment, where the substrate of the wafer is of the transmission type (such as, for example, a glass substrate), a wafer mark of the transmission type may be employed. Further, as a first alignment mark, the slit mark of the present embodiment may be replaced by a plurality of pin-hole marks while a concentrical holographic zone plate is applied as a hologram mark. In this instance, preferably a plurality of alignment marks in the form of pin-holes may be disposed in a suitable arrangement relationship (refer to FIG. 9B).

Where an alignment mark in the form of pin-holes is employed, diffraction light (reconstruction light) by the holographic zone plate is converted into convergent light (pin spot light) which has an image forming position which corresponds to the position at which the mask has been placed. The convergent beam may be reflected from the surface of the resist applied to the wafer or the wafer mark or may be transmitted through the wafer mark in the form of a pin-hole provided in the wafer, whereafter reflection or transmission inspection light is detected.

It is also possible to apply a zone plate to a first alignment mark or a wafer mark, and an example of this instance will be described below.

Figure 15:
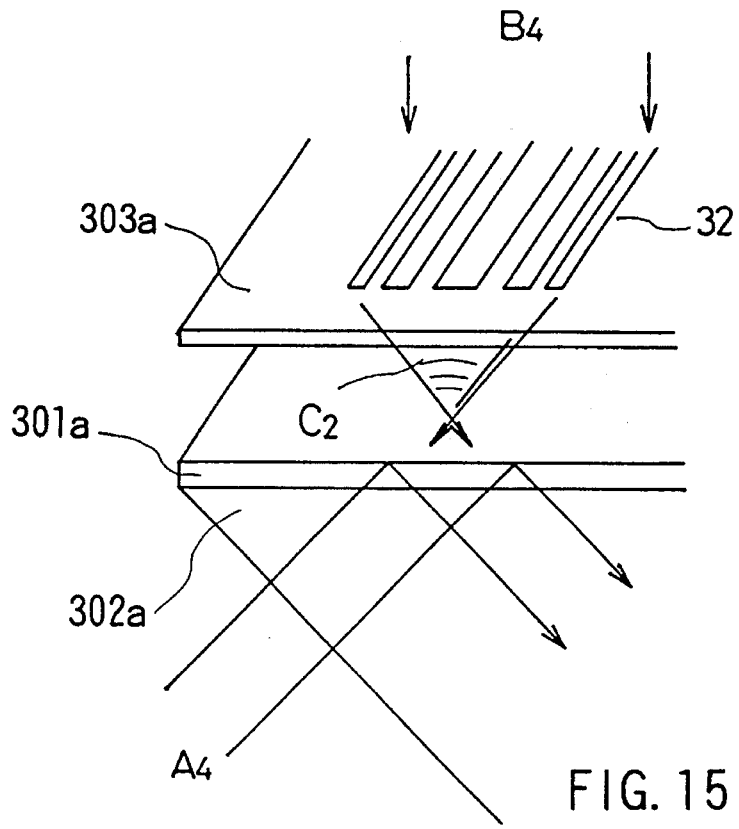
FIG. 15 illustrates a manner of essential part of the second embodiment when the second hologram is recorded with the system shown in FIG. 12.
Figure 16:
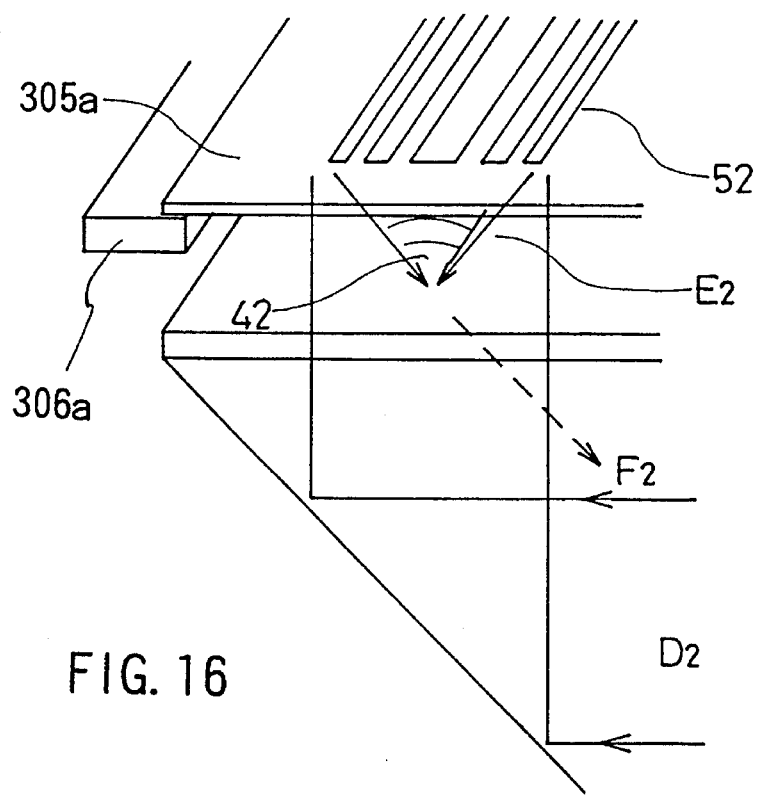
FIG. 16 illustrates the manner of essential part of the second embodiment when the second hologram is reconstructed with the system shown in FIG. 12.

In a second embodiment shown in FIGS. 15 and 16, an alignment zone plate 32 in the form of a slit of the shape of a linear zone plate is formed as a first alignment mark on a mask 303a, and a wafer zone plate 52 of the reflection type having the same shape as the alignment zone plate 32 is formed as a second alignment mark on a wafer 305a. A beam which is irradiated directly upon the wafer zone plate 52 is employed as inspection light for alignment, and reflection diffraction light here is used as a diffraction wave. In the present embodiment, the reflection diffraction wave is introduced into the hologram recording medium 301a, and diffraction light at a second hologram 42 formed on the hologram recording medium 301a is detected to effect detection of the relative position and alignment.

A hologram recording method of the alignment zone plate 32 formed on the mask 303a is similar to that of the example described hereinabove with reference to FIG. 12. In the present embodiment, the alignment zone plate 32 is employed as an alignment mark, and the construction of the zone plate is designed so that the appropriate gap between the mask and the hologram recording medium may be equal to the focal length depending upon the wavelength ($\lambda 2$) of illumination light used. Consequently, if object illumination light is irradiated upon the alignment zone plate 32, then transmission diffraction light (an object wave) from the alignment zone plate 32 makes a beam which converges at a specific focal position of the alignment zone plate 32.

In particular, an object wave from the alignment zone plate 32 makes a convergent cylindrical wave C2 which converges onto the hologram recording medium 301a, and by irradiating a reference wave A4 here, a linear second hologram 42 is formed.

Subsequently, while the relative positional relationship between the mask and the hologram recording medium is maintained, a first hologram of a circuit pattern is formed on the hologram recording medium. It is to be noted that, if necessary, fixation exposure of the hologram and so forth are performed.

In an alignment operation, a wafer 305 is held, in place of the mask 303a, in a pre-aligned condition at the position, to which the mask 303a has been placed, by the holding apparatus 306 as shown in FIG. 16.

Patterning has been performed one or more times for the wafer 305a already, and a wafer zone plate 52 described above is formed as a wafer mark on the wafer 305a as shown in FIG. 16. While the construction and the arrangement of the wafer zone plate 52 are similar to those of the alignment zone plate 32 of the mask, the wafer zone plate 52 is different in that it is of the reflection type. Upon alignment operation, wafer mark illumination light D2 of the same wavelength as that of object illumination light (reference light) used upon hologram formation is irradiated onto the wafer zone plate 52.

While the wafer mark illumination light D2 is irradiated perpendicularly upon the surface of the wafer, since the wafer mark employed is of the reflection type, a beam which has been irradiated perpendicularly onto the hologram recording medium 301a and passed through the second hologram 42 is used as the wafer mark illumination light D2. In particular, the wafer mark illumination mark D2 is introduced horizontally into a vertical minor side of the prism 302a and then totally reflected by an inner face of a major oblique side of the prism 302a so that it is introduced vertically upwardly into the second hologram 42. It is to be noted that, while a light source separate from the light source used upon formation of the hologram mark is used, in the present embodiment, as a light source for illumination of the wafer mark, the same light source may be used.

When the wafer mark illumination light D2 having passed through the second hologram 42 is irradiated onto the wafer zone plate 52, a reflection diffraction wave from there makes a convergent cylindrical wave E2, which converges at an image forming position peculiar to the wafer zone plate 52. Similarly as described hereinabove, since the wafer zone plate 52 has a similar construction to the alignment zone plate 32, when the wafer 305a is located at the same position as the position at which the mask 303 has been located upon recording of the second hologram 42, the convergent cylindrical wave E2 which is detection light converges upon the hologram recording medium 301a and forms an image of the wafer zone plate 52 on the second hologram 42.

Here, from the characteristics of a holographic technique, if a beam equivalent to an object wave used upon recording of a hologram is irradiated onto the hologram, then a diffraction wave which advances a path of the opposite direction to that of a reconstruction wave to the hologram is obtained. In the present embodiment, a beam of the path of the opposite direction to that when a hologram reconstruction image is formed is utilized for detection of alignment.

Transmission diffraction light F2 obtained when the second hologram 42 is irradiated with the convergent cylindrical wave E2 making use of the characteristics is detected by means of a detector which will be hereinafter described at a position of the opposite direction to that of the incidence path of the reconstruction wave (or the position where reflection light of reference light upon formation of the hologram advances), and by such detection, it is detected whether or not the wafer and the hologram recording medium are positioned accurately relative to each other.

In particular, the detection intensity by the detection means varies depending upon whether or not the second hologram 42 is present at the converging position of the convergent cylindrical wave E2, and the detection intensity presents its maximum when the second hologram 42 is positioned accurately. Consequently, alignment is performed by position control of the holding apparatus 306a in response to such detection information.

Since the transmission diffraction light F2 in the present embodiment is a beam which advances in a direction quite different from that of the wafer mark illumination light D2 or simple reflection light of the wafer mark illumination light D2 from the surface of the wafer or the like, a good detection signal having little noise can be obtained upon alignment operation without being influenced by any other beam.

Also in the present embodiment, preferably pre-alignment is performed before the wafer 305a is set in position. However, in order to detect an error in the X–Y direction, a rotational error in a plane of the X–Y direction and so forth, preferably a plurality of alignment zone plates 32 in the form of zone plates having longitudinal directions which coincide with the X direction and the Y direction are provided individually.

Further, while the wafer zone plate 52 of the reflection type is used as a wafer mark in the present embodiment, it is possible to use a wafer mark, for example, in the form of a transmission slit or the like not only where the wafer is made of a material of the transmission type but also where the wafer is made of a material of the non-transmission type. In this instance, transmission diffraction light from a wafer mark when a same beam as object illumination light used upon formation of the hologram is irradiated as wafer mark illumination light onto the wafer mark may be utilized as detection light similarly as in the embodiments described above, and it is also possible to use the wafer mark illumination optical system also as an object illumination optical system for hologram formation.

Subsequently, a third embodiment of an alignment operation will be described with reference to FIGS. 18 and 19. In the present embodiment, an alignment zone plate 33 in the form of a transmission region having the shape of a concentrical zone plate is used as a first alignment mark of a mask 303b, and a wafer zone plate 53 of the reflection type having the same shape as that of the alignment zone plate 33 is used as a second alignment mark of a wafer 305b.

Also in the present embodiment, the method of forming a second hologram from an alignment mark formed on the mask 303b is substantially similar that in the second embodiment described above. While the alignment zone plate 33 is used as a first alignment mark here in the present embodiment, the zone plate is so shaped that the focal length with a wavelength of illumination light used is greater than that of a gap between the mask and the hologram recording medium, that is, a convergent spherical wave C3 diffracted by the alignment zone plate 33 does not converge upon the hologram recording medium 301b but converges at a position at which it passes through the hologram recording medium.

When object illumination light B6 is irradiated upon the alignment zone plate 33, the convergent spherical wave is obtained as an object wave, and while the convergent spherical wave C3 converges, it is irradiated upon the hologram recording medium 301b. Further, a reference wave A6 is irradiated upon the same position from the reverse face side, and a second hologram 43 is formed in the hologram recording medium 301b by mutual interference between the convergent spherical wave C3 and the reference wave A6. Then, in this condition, a first hologram is recorded based on the circuit pattern of the mask 303b, and thereafter, the mask 303b is removed. Then, a wafer 305b is held instead at the same position by the holding apparatus 306b.

Several manners are available for an alignment operation in this instance. In the present embodiment, reconstruction light from the second hologram 43 is used as alignment inspection light to form a real image of the alignment zone plate 33 on the wafer mark while reflection diffraction light from the wafer zone plate 53 of the wafer mark is utilized as detection light.

Figure 19:
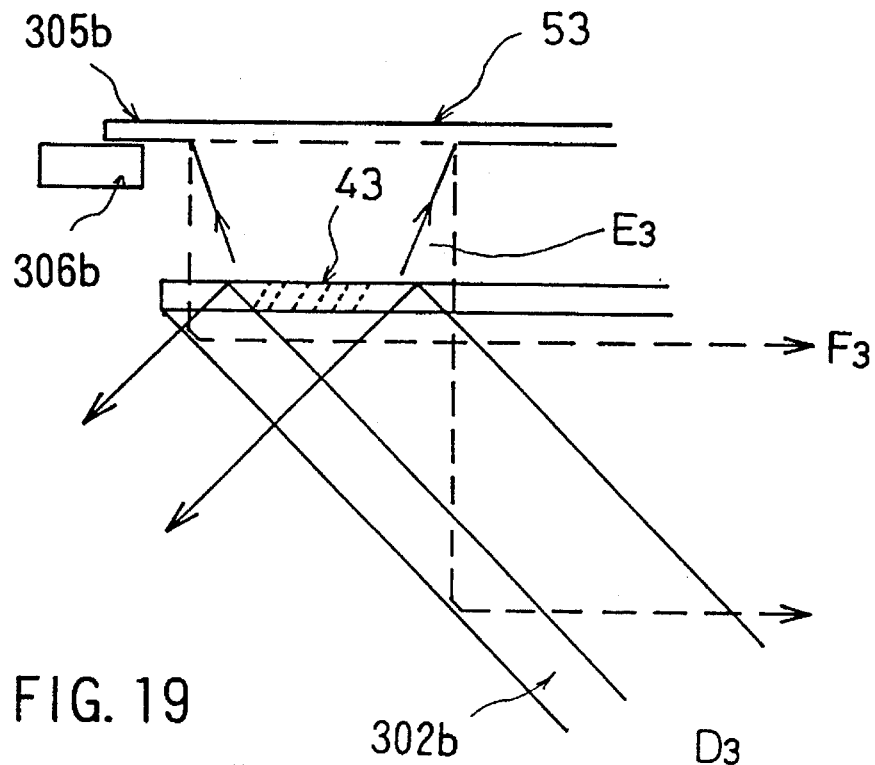
FIG. 19 illustrates a manner of essential part of the third embodiment when the second hologram is reconstructed with the system shown in FIG. 12.

If hologram illumination light D3 in the form of reconstruction light conjugate with the reference wave A6 is irradiated upon the second hologram 43 as shown in FIG. 19, then reconstruction light transmitted and diffracted by the second hologram 43 is irradiated as divergent light E3 onto the wafer 305b. If the wafer zone plate 53 as a wafer mark is present in an accurately positioned relationship at the irradiation position, then the former divergent light E3 is reflected and diffracted by the wafer zone plate 53 to make parallel light, which enters the hologram recording medium 301b again. The reflection diffraction light F3 passes through the hologram recording medium 301b and is reflected by total internal reflection by the major oblique side of the prism 302b so that it is thereafter introduced into the detector which will be hereinafter described.

The detection intensity of the reflection diffraction light F3 presents its maximum when the converging positions of the former divergent light E3 and the convergent light C3 coincide with each other, that is, when the wafer 305b is positioned accurately, but when the wafer 305b is displaced in the X–Y direction or when the gap is not correct, the detection intensity presents a reduced value. Consequently, the alignment is completed by performing position correction control by means of the holding apparatus 306b so that the detection intensity may present its maximum in accordance with a result of the detection.

Figure 18:
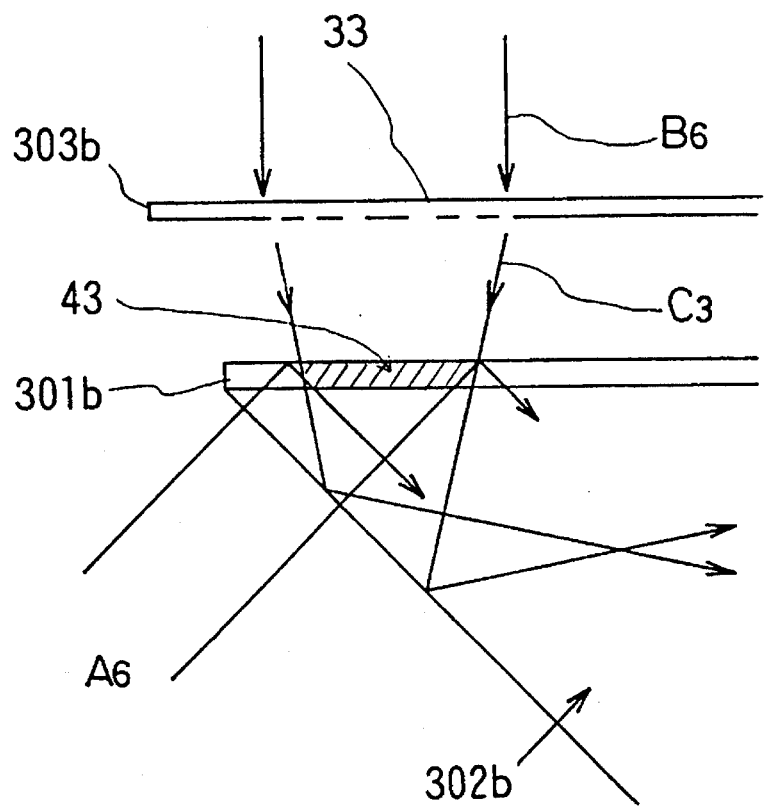
FIG. 18 illustrates a manner of essential part of the third embodiment when the second hologram is recorded with the system shown in FIG. 12.
Figure 20:
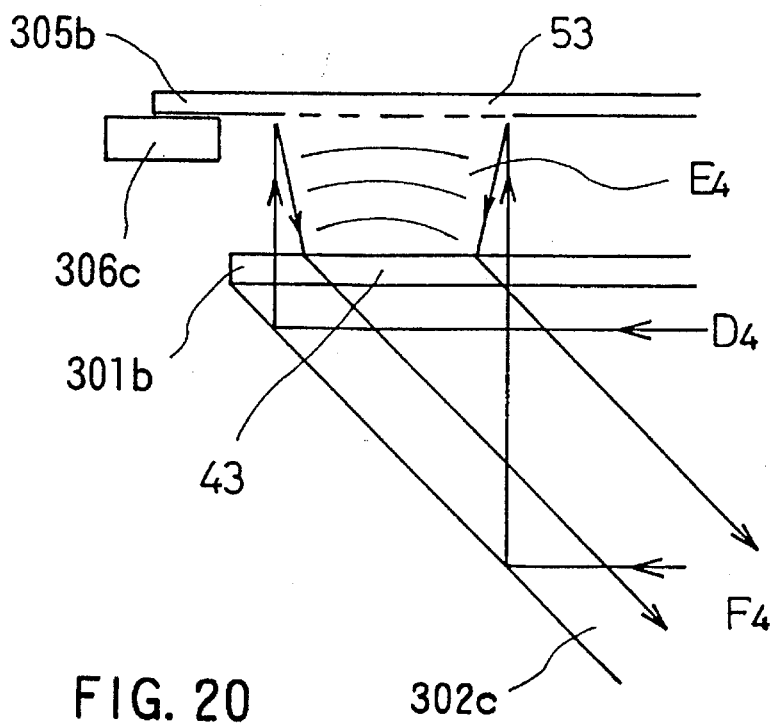
FIG. 20 illustrates a manner of essential part of the fourth embodiment when the second hologram is reconstructed with the system shown in FIG. 12.

A fourth embodiment of an alignment method which makes use of the hologram 43 of the alignment zone plate 33 recorded in such a manner as shown in FIG. 18 will be described with reference to FIG. 20. In the present embodiment, also a wafer zone plate 53 as a wafer mark has a similar construction to that in the third embodiment described above. As shown in FIG. 20, wafer illumination light D4 in the form of a parallel beam of the same wavelength as that of the object wave and the reference wave used upon formation of the hologram is totally reflected by a major oblique portion of a prism 302c so that it is irradiated perpendicularly onto a hologram recording medium 301b. The wafer illumination light D4 thus passes through the second hologram 43 and is irradiated perpendicularly onto the wafer zone plate 53. The wafer illumination light D4 is reflected and diffracted by the wafer zone plate 53 to make a convergent wave E4, which enters the hologram recording medium 301b again.

When the converging position of the convergent wave E4 coincides with the converging position of the convergent spherical wave C3 which is an object wave upon recording of the hologram second hologram 43, that is, when the wafer 305b is in an accurately positioned condition, the convergent wave E4 is diffracted by the wafer zone plate 53 to make transmission diffraction light F4 which advances in the same direction (opposite direction to a hologram reconstruction wave) as the advancing direction of the reference wave A6 used upon formation of the hologram.

Where the detector which will be hereinafter described is arranged in the advancing direction of the reference wave A6, the transmission diffraction wave F4 is detected by the detector, and the condition wherein the detection intensity of the detector presents its maximum is the condition wherein the wafer 305b is positioned accurately. However, when there is some displacement in the X–Y direction or when the gap is not correct, the detection intensity presents a lower value. Consequently, alignment is performed by correcting the position of the wafer 305b by means of the holding apparatus 306c so that the detection intensity of the transmission diffraction light F4 may present its maximum.

Figure 21:
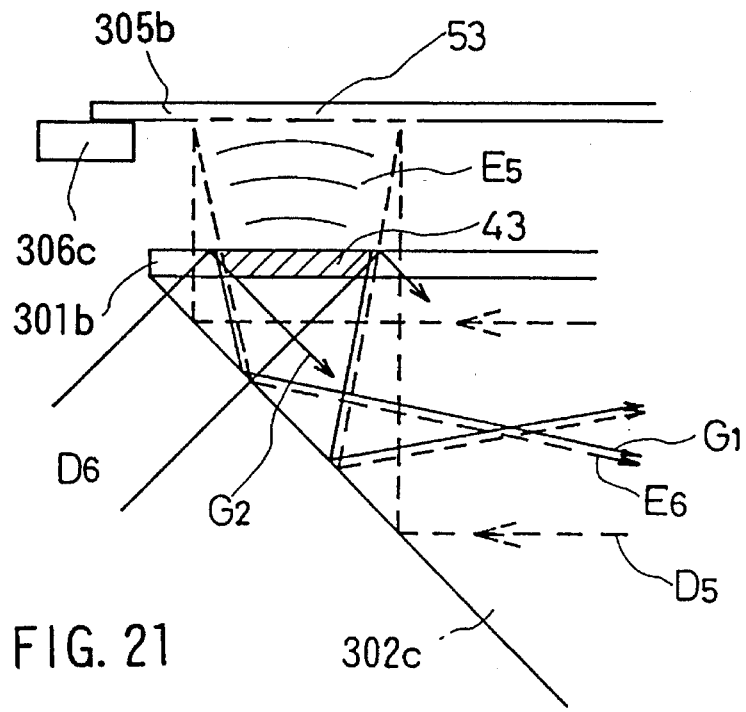
FIG. 21 illustrates a manner of essential part of the fourth embodiment when the second hologram is reconstructed with the system shown in FIG. 12.

Subsequently, another embodiment of an alignment method which makes use of the same second hologram 43 as that in the fourth embodiment described above will be described with reference to FIG. 21. Also in the present embodiment, a diffraction wave from a wafer mark is utilized using wafer mark illumination light similarly, and also a wafer zone plate 53 as such wafer mark has a similar construction as in the case of FIG. 20. The present embodiment is characterized in that not diffraction light which is produced when the second hologram 43 is irradiated with the convergent wave E4 but simple transmission light is used as detection light, and detection light in the form of simple transmission light is used as transmission convergent light E6.

Since, from the characteristics of the holographic technique, the case wherein the converging position of the transmission convergent light E6 coincides with the converging position of the object wave upon recording of the hologram is a condition wherein the wafer 305b is positioned accurately with respect to the hologram recording medium 301b as described hereinabove, the relative positional relationship between the wafer and the hologram recording medium can be detected by detecting the converging position of the transmission converging light E6. The converging position of the transmission convergent light E6 can be detected, for example, by detecting a detection condition of a photo-detector or a like detector disposed at one of a pair of focus positions of a lens system which is provided in the detection system and has the other focus at an appropriate converging position.

In the present embodiment, the characteristics of holographic technique are utilized more cleverly such that another beam which converges at the converging position of the former object wave is utilized as reference light and displacement (registration) between the reference light and the transmission convergent light E6 is detected to detect the converging condition of the transmission convergent light E6. In particular, in the present embodiment, same hologram illumination light D6 as the reference wave used upon recording of the hologram is irradiated onto the second hologram 43 upon alignment and reflection diffraction light from the second hologram 43 is used as reference light.

This is an application of one of the characteristics of holographic techniques that, if a same beam as a reference wave used upon recording of a hologram is irradiated onto a hologram formed once, then diffraction light which passes through the hologram following the same path as that of an object wave used upon recording of the hologram is obtained.

Where this characteristic is utilized, since reflection diffraction light G1 from the second hologram 43 of the hologram illumination light D6 follows the same path as that of transmission light of the object wave used upon recording of the hologram, it is detected that, when the reflection diffraction light G1 and the former transmission convergent light E6 coincide with each other, this is the condition wherein the wafer is positioned accurately. Accordingly, alignment is completed by detecting the reflection diffraction light G1 and the transmission convergent light E and correcting the position of the wafer by the holding apparatus 306c so that the reflection diffraction light G1 and the transmission convergent light E6 may coincide with each other.

Figure 17A:
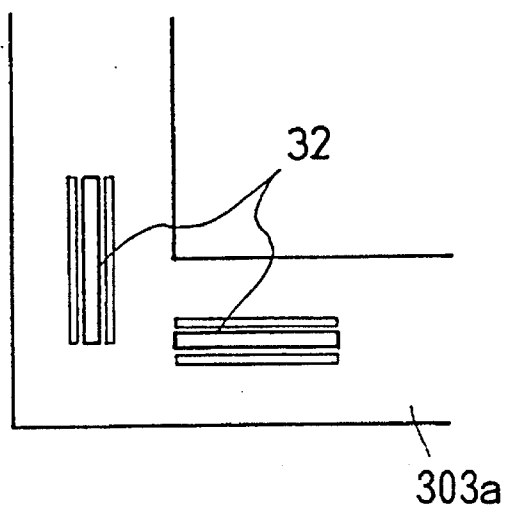
FIGS. 17A and 17B show patterns of the first alignment mark according to the third and fourth embodiments, respectively.
Figure 17B:
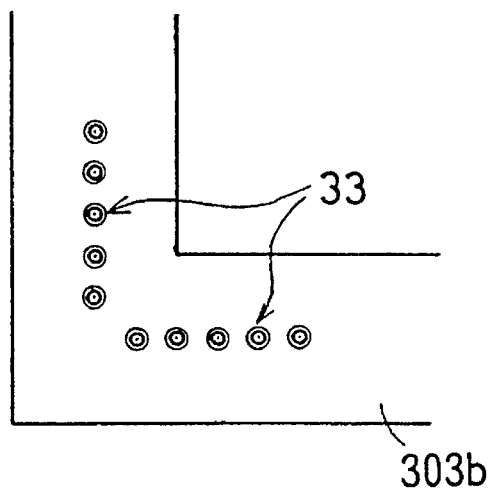

It is to be noted that, naturally, also in those embodiments, a wafer mark of the transmission type can be used similarly as in the embodiments described above. Further, where three or more sets each including a plurality of alignment zone plate 33 composed of concentrical zone plates and disposed in the X and Y directions as shown in FIG. 17B are provided, accurate relative position detection and alignment in any direction can be performed. In the embodiments described above, a mark alignment zone plate 33 is provided at each corner portion around a mask pattern to individually effect relative position detection.

Further, the alignment method described last which makes use of reference light can be applied to the other preceding embodiments. For example, when the hologram illumination light D6 is irradiated onto the second hologram, simple reflection light G2 is produced in addition to the reflection diffraction light G1, and the simple reflection light G2 makes reference light which advances along the same path (in the opposite direction to that of a reconstruction wave) as that of the reference wave used upon recording of the hologram. Consequently, by using the reference light (reference reflection light G2) as reference light in the preceding embodiments for comparison and detection, the relative position between the wafer and the hologram can be detected.

The detection system in the embodiments described so far may employ any of the methods described hereinabove in connection, for example, with FIGS. 3, 4, 5 and 6 only if it can detect the intensity at least of detection light. However, in order to detect a very small amount of displacement or the like, line scanning, small deflection angle oscillation scanning or the like may be combined with the detection optical system.

Further, the detector may be of another type wherein not only the intensity of light but also a wave front or the like of detection light is detected to detect relative displacement. For example, the detector for detecting that the detection light (diffraction light F3 or F4) is parallel light (a positioned condition) as in the embodiment shown in FIG. 19 or 20 is required to only detect displacement of the detection light from a parallel condition.

Further, when only detection of a gap is considered, a gap can be detected only if the detector can detect that the converging position of transmission or reflection diffraction light of a zone plate which is applied to a first alignment mark and/or a second hologram and a wafer mark coincides with the surface of the wafer or the hologram formation position.

An example of such detection will be described with reference to FIGS. 22 to 24. The embodiment of the detection system is used as the detection system in the embodiments shown in FIG. 19 and can be applied to the case wherein it is to be detected whether or not a beam to be detected is parallel light or the like. In the present embodiment, a proceeding condition of reflection diffraction light F3 is detected, and various elements are arranged with reference to an advancing direction (optical axis) of a reference wave upon formation of a hologram.

Here, in a condition wherein some displacement is involved in a gap, that is, in a defocused condition, the reflection diffraction light F3 becomes divergent light or convergent light. On the other hand, when the gap is accurate but involves lateral displacement (displacement in the X–Y direction), the reflection diffraction light F3 is parallel light but has a varied advancing direction. A variation of a wave front of the light is detected applying an astigmatism method. The astigmatism method is normally used for automatic focusing of a camera, and a gap can be detected by applying the principle of such automatic focusing as it is.

In the present embodiment, the reflection diffraction light F3 enters, by way of an optical system including a cylindrical lens 813, a four-split detector 817 located at a focus position of the cylindrical lens 813. Here, the four-split detector 817 is divided into four light receiving portions K1 to K4 in the X–Y directions as shown in FIG. 23. In the present embodiment, when the relative positional relationship between the wafer mark and the second hologram is appropriate, the reflection diffraction light F3 becomes parallel light, and accordingly, a focused spot is formed at a central portion of the four-split detector 817 as indicated at the center of FIG. 24 so that detection intensities from the light receiving portions K1 to k4 may be equal to each other.

Figure 24:
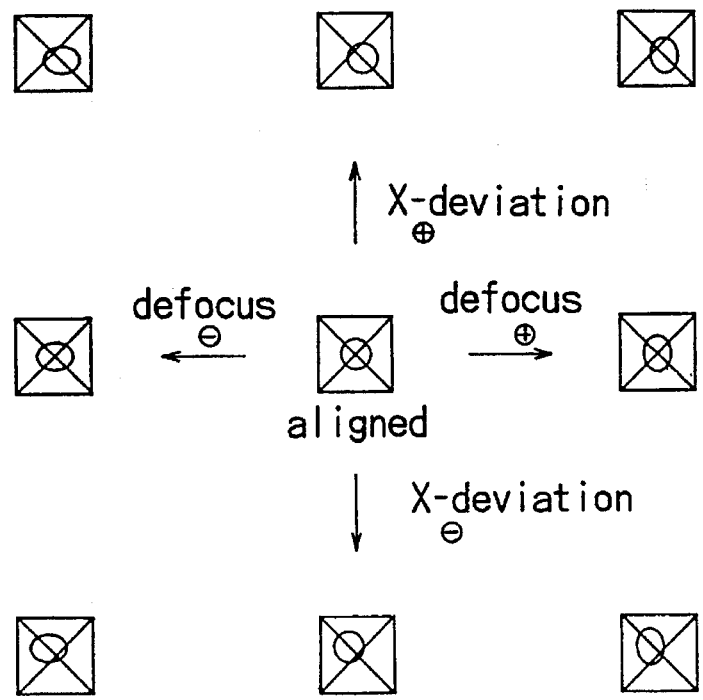
FIG. 24 diagrammatically illustrates the relationship between the position of an incident beam to the four-split detector and a displacement condition.

On the other hand, where the gap involves some displacement as shown at a left or right portion in a middle row in FIG. 24, the reflection diffraction light F3 forms an elliptically deformed focused spot on the four-split detector 817, and the detection intensity is different between adjacent ones of the light receiving portions of the four-split detector 817. Further, where some displacement in the X–Y directions is involved, the focused light is displaced from the center of the four-split detector 817 as shown at an upper or lower portion in a central column in FIG. 24, and consequently, the detection intensities from the light receiving portions are different from one another. When such displacements occur compositely, the focused light spot involves such deformation and displacement as shown at any of diagonal portions in FIG. 24.

In this manner, a variation of the light converging condition corresponding to the displacement of the gap and in the X–Y directions appears as shown in FIG. 24, and by detecting a difference of the detection intensities at the light receiving portions of the four-split detector 817 corresponding to the variation, the direction and the amount of the relative displacement between the wafer and the hologram recording medium can be detected.

In particular, making use of the fact that a beam incident to the four-split detector 817 forms a circular spot when the gap is appropriate, a value S is calculated from the outputs of the four light receiving portions K1 to K4 of the four-split detector 817 in accordance with the following equation:

$$S=\{(K1+K3)-(K2+K4)\}/(K1+K2+K3+K4)$$

When the value S is S=0, the gap is correct.

On the other hand, when some displacement in the X–Y directions occurs, since the curvature of a wave front to be detected does not present any variation but the advancing direction presents some variation, the position of the spot on the four-split detector 817 moves in the direction of the displacement. In this instance, TX and TY given below make signals representative of amounts of the displacement in the X direction and the Y direction in FIG. 24, and when no displacement is involved, TX and TY are both equal to zero.

$$TX=\{(K2+K3)-(K1+K4)\}/(K1+K2+K3+K4)$$

$$TY=\{(K3+K4)-(K1+K2)\}/(K1+K2+K3+K4)$$

In this manner, in the present embodiment, using the optical system which applies the astigmatism method, by calculating the values mentioned above from the output signals of the four-split detector, the relative displacement information between the wafer and the hologram is detected and the relative positional relationship is modified in accordance with the relative displacement information to achieve alignment.

Figure 25:
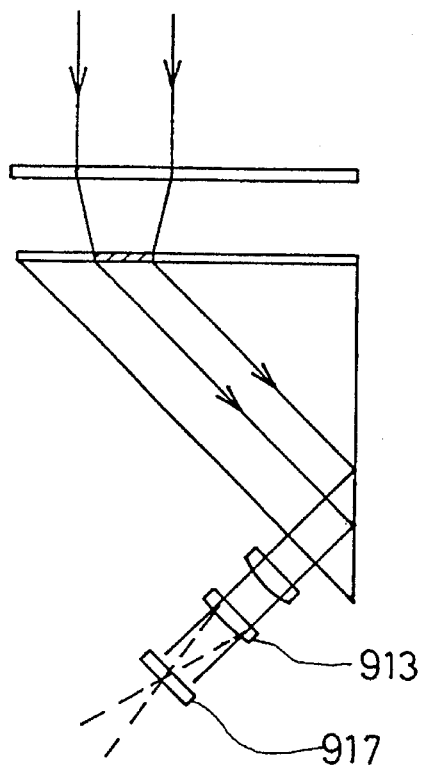
FIG. 25 shows an example of a detection optical system in the embodiment shown in FIG. 20.
Figure 26:
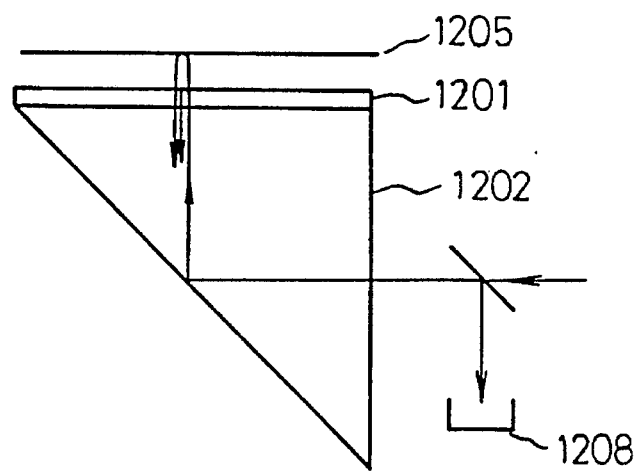
FIG. 26 schematically shows an example of a conventional alignment system in hologram exposure.

On the other hand, an embodiment of a detection system shown in FIG. 25 is used as the detection system of the embodiment shown in FIG. 20. In the present embodiment, an advancing condition of transmission diffraction light F4 is detected, and to this end, various elements are arranged with reference to an advancing direction (optical axis) of a reference wave upon formation of a hologram.

Here, in a condition wherein the gap involves some displacement, that is, in a defocused condition, the transmission diffraction light F4 becomes divergent light or convergent light. On the other hand, when the gap is appropriate but involves some displacement in the X–Y direction, the transmission diffraction light F4 is parallel light but has a different advancing direction. Such variation of the wave front is detected applying the astigmatism method similarly as described above.

In the present embodiment, the transmission diffraction light F4 is introduced, by way of an optical system including a cylindrical lens 913, into a four-split detector 917 disposed at a focus position of the cylindrical lens 913. Here, the four-split detector 917 may have a similar construction to that of the four-split detector 817 in the detection system shown in FIG. 22.

Accordingly, also in this instance, where the relative positional relationship between the wafer and the hologram is accurate, the transmission diffraction light F4 becomes parallel light, and consequently, the transmission diffraction light F4 forms a converging spot at the center of the four-split detector 917 as shown at the center of FIG. 24 and the detection intensities from the light receiving portions K1 to K4 of the four-split detector 917 are equal to one another.

On the other hand, when the gap involves some displacement as shown at a left or right portion in the middle row in FIG. 24, the reflection diffraction light F4 forms an elliptically deformed converging light spot on the four-split detector 917 and the detection intensities of adjacent ones of the light receiving portions of the four-split detector 917 are different from each other. Further, when the gap involves some displacement in the X–Y directions, the converging light spot is displaced from the center of the four-split detector 917 as shown at an upper or lower portion in the middle column in FIG. 24 and the detection intensities from the light receiving portions are different from one another. When such deformation and displacement occur compositely, the converging light spot involves some deformation and displacement as shown at diagonal portions in FIG. 24.

It is to be noted that, while, in the embodiment described above, it is described that positioning of the gap and the positioning in the X–Y direction are performed at a time, when it is difficult to determine only from the detection intensity whether displacement of the gap is involved or displacement in the X–Y direction is involved, a detection system for detection of a gap and another detection for detection of displacement in the X–Y direction may be provided separately. Further, if a detection system for detection of a gap is prepared for a plurality of positions (for example, at three positions), then it is possible to detect a tilted condition of the wafer simultaneously.

Further, while a pin-hole (or a concentrical zone plate) or a slit (or a linear zone plate) is described separately as a first alignment mark, a second alignment mark or a wafer mark, selection of one of them should be made suitably taking arrangement conditions of a circuit pattern and an alignment mark of a mask with respect to the mask, arrangement conditions of a wafer and so forth into consideration, and where a plurality of alignment marks are involved, they may be provided in a mixed condition.

Figure 22:
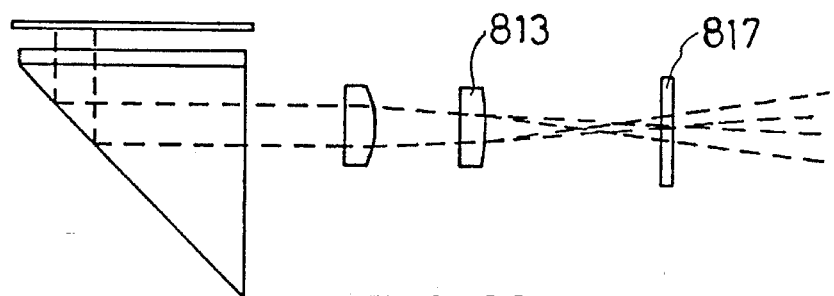
FIG. 22 shows an example of a detection optical system in the embodiment shown in FIG. 19.
Figure 23:
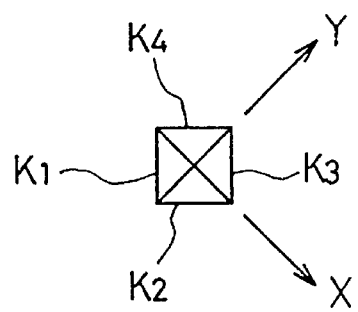
FIG. 23 schematically shows construction of a light receiving detection face of a four-split detector in the detection optical system shown in FIG. 22.

Further, the dynamic range of the detection system shown in FIG. 22 or 25 depends upon the size of the zone plate. Consequently, if the size of the zone plate is increased, then relative displacement can be detected even if the amount of the displacement is great, and accordingly, it is also possible to use the detection system for pre-alignment. Then, more accurate alignment may thereafter be performed using the detection method of any of the embodiments shown in FIGS. 15, 16 and 20. Further, if the alignment methods described in the embodiments described above are used stepwise in combination, then the dynamic range in relative position measurement is expanded, and besides relative position detection of a higher accuracy can be performed.

What is claimed is:

1. An exposure apparatus for reproducing a pattern of a mask onto a photosensitive surface of a substrate using a holographic technique, comprising:

means for recording a first hologram of the pattern of the mask in a hologram recording medium by interference of a first object wave, derived from light diffracted by said pattern of the mask, with a first reference wave in the form of coherent light;

means for reconstructing an image of the pattern of the mask at the photosensitive surface of said substrate by irradiating said first hologram with a first reconstruction wave conjugate with the first reference wave, said substrate being arranged at a position of said mask during recording of said first hologram;

an object wave irradiation optical system for illuminating a first alignment mark formed on said mask, with coherent light to form a transmitted diffracted light beam diffracted by said first alignment mark, and directing said transmitted diffracted light beam onto said hologram recording medium to form a second hologram mark corresponding to the first alignment mark;

a reference wave irradiation optical system for generating a second reference wave in the form of coherent light and transmitting the second reference wave to said hologram recording medium for interference with said transmitted diffracted light beam in said hologram recording medium and formation of said second hologram mark;

a wafer mark illumination optical system for introducing light having a wavelength equal to that of the transmitted diffracted light beam to a second alignment mark formed on the surface of said substrate and introducing diffracted light produced, from the light introduced to the second alignment mark, to said second hologram mark formed on said hologram recording medium;

transmission light measurement means for measuring transmitted light produced, from the second hologram mark, by the light introduced to the second alignment mark; and a relative position detection means for detecting a relative displacement between said hologram recording medium and said substrate on the basis of the transmitted light measured by said transmission light measurement means;

wherein the first alignment mark has a predetermined zone plate pattern, and the second alignment mark has a predetermined pattern in the form of a zone plate selected so as to produce a diffraction wave equivalent to the transmitted diffracted light beam diffracted by the first alignment mark.

2. An exposure apparatus according to claim 1, and further comprising reference reflection light detection means for introducing a reference inspection light, equivalent to the second reference wave, to said second hologram mark and detecting reflected light reflected from said second hologram mark.

3. An exposure apparatus according to claim 1, and further comprising correction means for correcting a relative positional relationship between said hologram recording medium and said substrate on the basis of the relative displacement detected by said relative position detection means.

* * * * *